(12) United States Patent
Tobita

(10) Patent No.: US 7,664,218 B2
(45) Date of Patent: Feb. 16, 2010

(54) SHIFT REGISTER AND IMAGE DISPLAY APPARATUS CONTAINING THE SAME

(75) Inventor: Youichi Tobita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 63 days.

(21) Appl. No.: 11/831,131

(22) Filed: Jul. 31, 2007

(65) Prior Publication Data

US 2008/0101529 A1    May 1, 2008

(30) Foreign Application Priority Data

Oct. 26, 2006   (JP)   ............................. 2006-291193

(51) Int. Cl.
*G11C 19/00*    (2006.01)
(52) U.S. Cl. .............................. 377/64; 377/69; 377/70
(58) Field of Classification Search .................. 377/64, 377/68–70, 74, 78–79
See application file for complete search history.

(56) References Cited

U.S. PATENT DOCUMENTS

| | | | |
|---|---|---|---|
| 3,573,490 A | | 4/1971 | Sevin, Jr. et al. |
| 5,859,630 A | * | 1/1999 | Huq ........................... 345/100 |
| 6,970,530 B1 | * | 11/2005 | Wang et al. .................... 377/69 |
| 7,038,653 B2 | * | 5/2006 | Moon .......................... 345/100 |
| 7,120,221 B2 | * | 10/2006 | Moon ........................... 377/64 |
| 7,203,264 B2 | * | 4/2007 | Lo et al. ........................ 377/64 |
| 7,317,779 B2 | * | 1/2008 | Moon et al. ..................... 377/64 |
| 2007/0164973 A1 | | 7/2007 | Tobita |
| 2007/0195053 A1 | | 8/2007 | Tobita et al. |
| 2007/0195920 A1 | | 8/2007 | Tobita |
| 2007/0217564 A1 | | 9/2007 | Tobita |

FOREIGN PATENT DOCUMENTS

| | | |
|---|---|---|
| JP | 2004-246358 | 9/2004 |
| JP | 2006-24350 | 1/2006 |

OTHER PUBLICATIONS

U.S. Appl. No. 11/937,791, filed Nov. 9, 2007, Tobita.
U.S. Appl. No. 11/838,416, filed Aug. 14, 2007, Tobita, et al.

* cited by examiner

*Primary Examiner*—Tuan Lam
(74) *Attorney, Agent, or Firm*—Oblon, Spivak, McClelland, Maier & Neustadt, L.L.P.

(57) ABSTRACT

A shift register includes a first transistor supplying an output terminal with a clock signal input to a first clock terminal and a second transistor discharging the output terminal. Defining the gate node of the first transistor as a first node, and the gate node of the second transistor as a second node, the shift register includes an inverter circuit in which the first node serves as its input node and a capacitive element serves as a load, and a buffer circuit receiving the output from the inverter circuit and outputting a signal to the second node.

2 Claims, 36 Drawing Sheets

F I G . 2
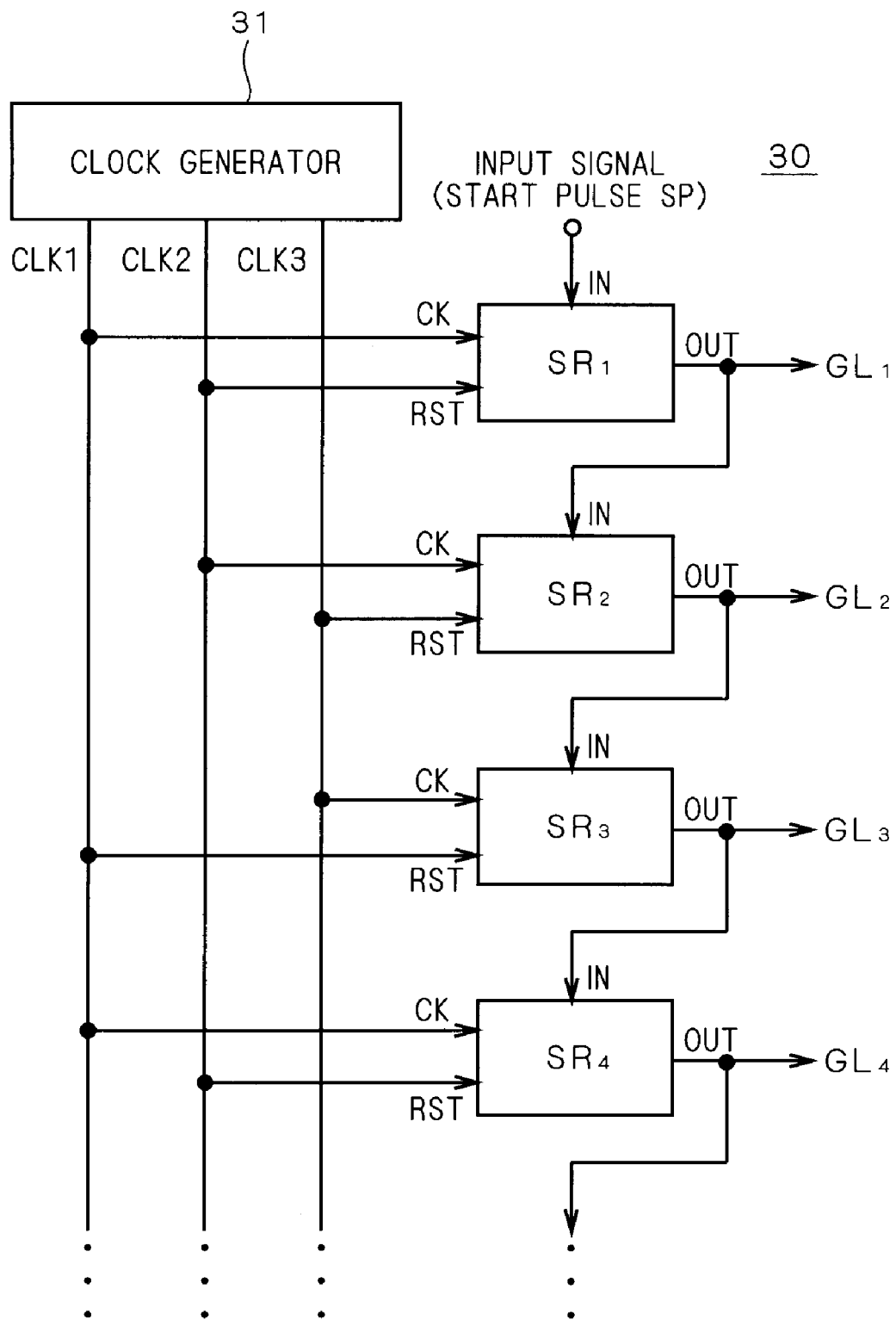

F I G . 3
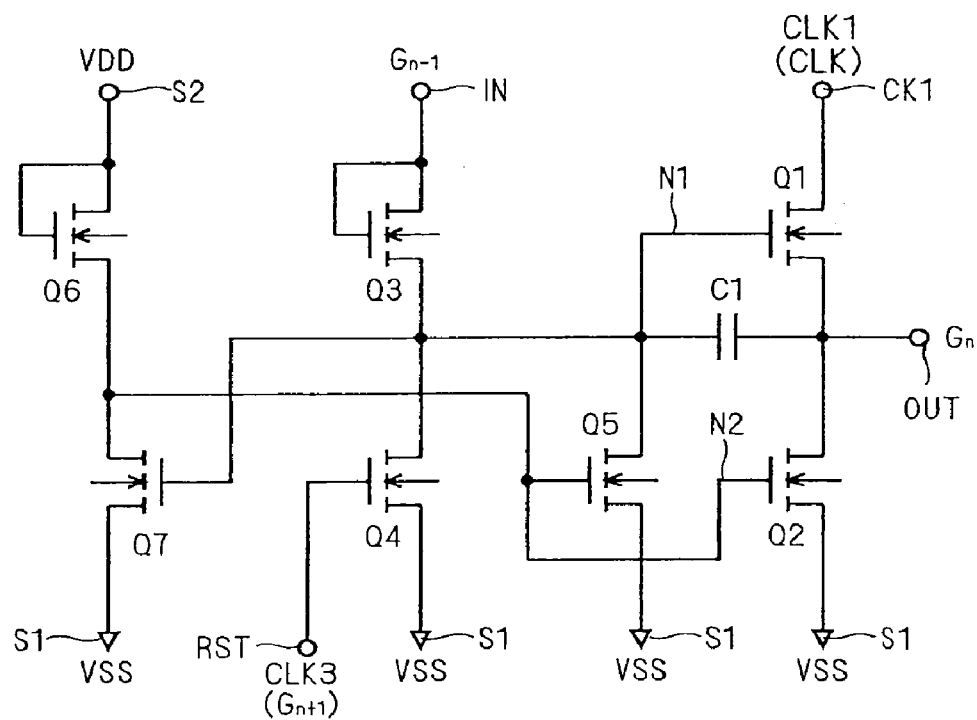
PRIOR ART

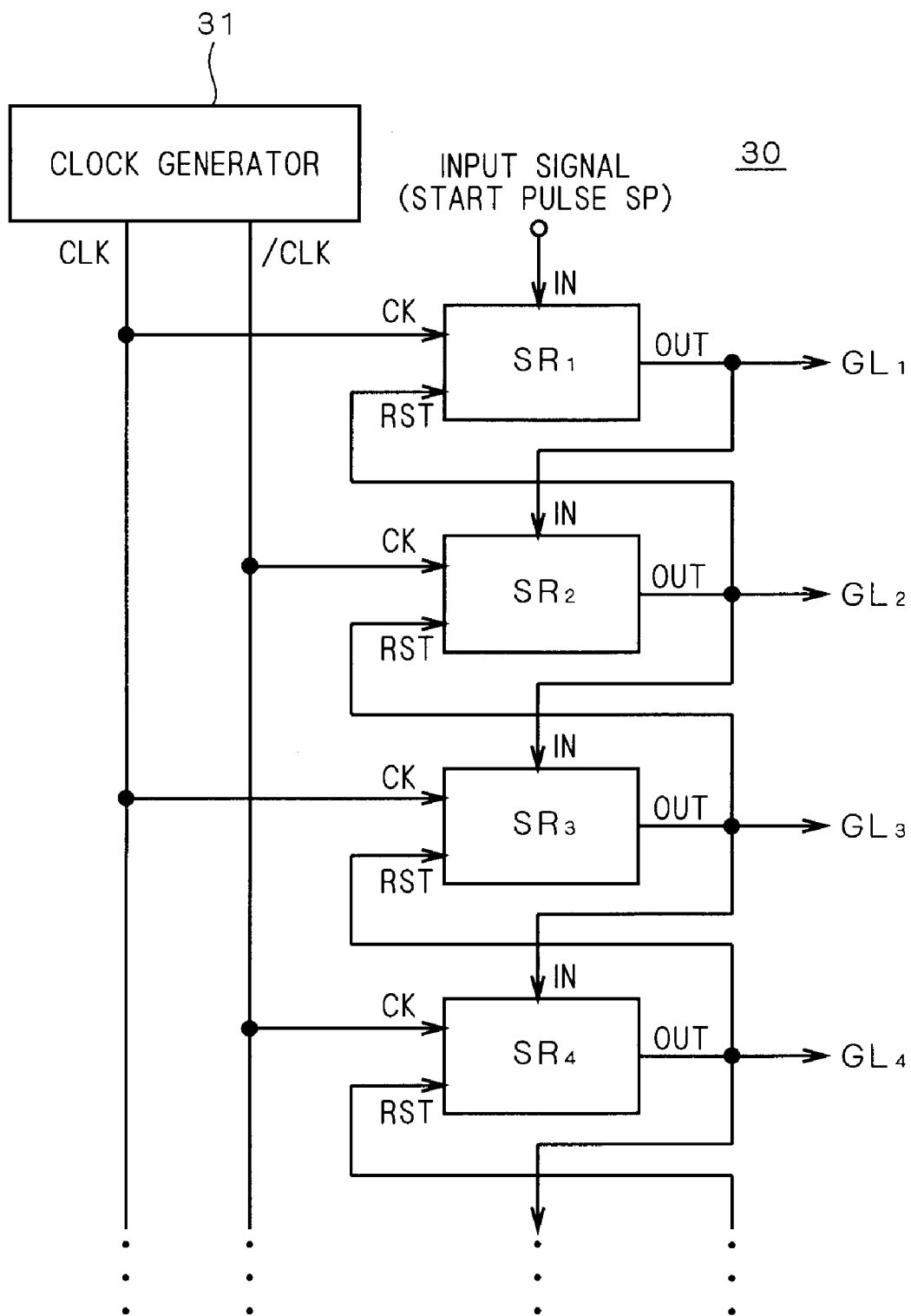
F I G . 5

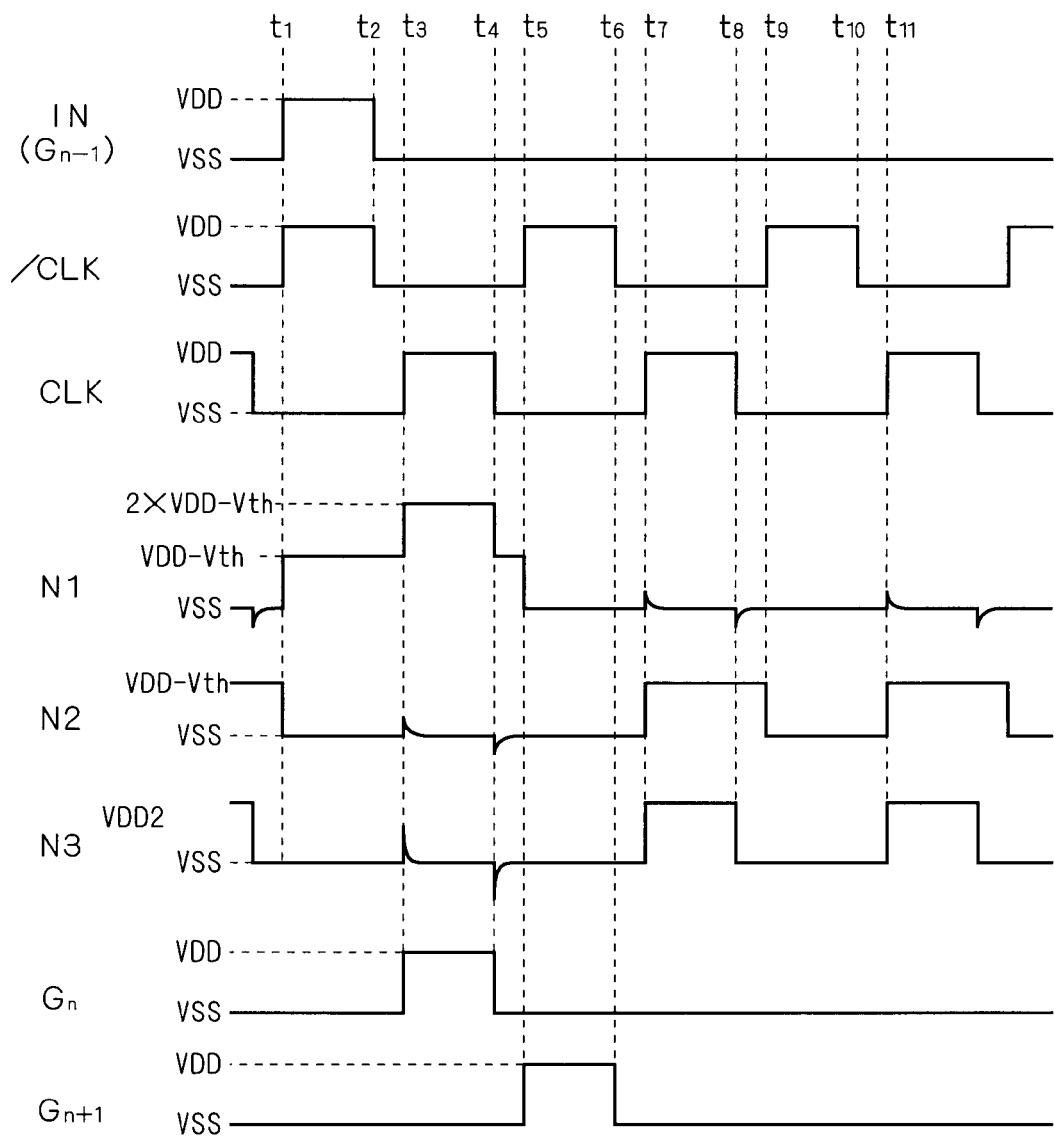

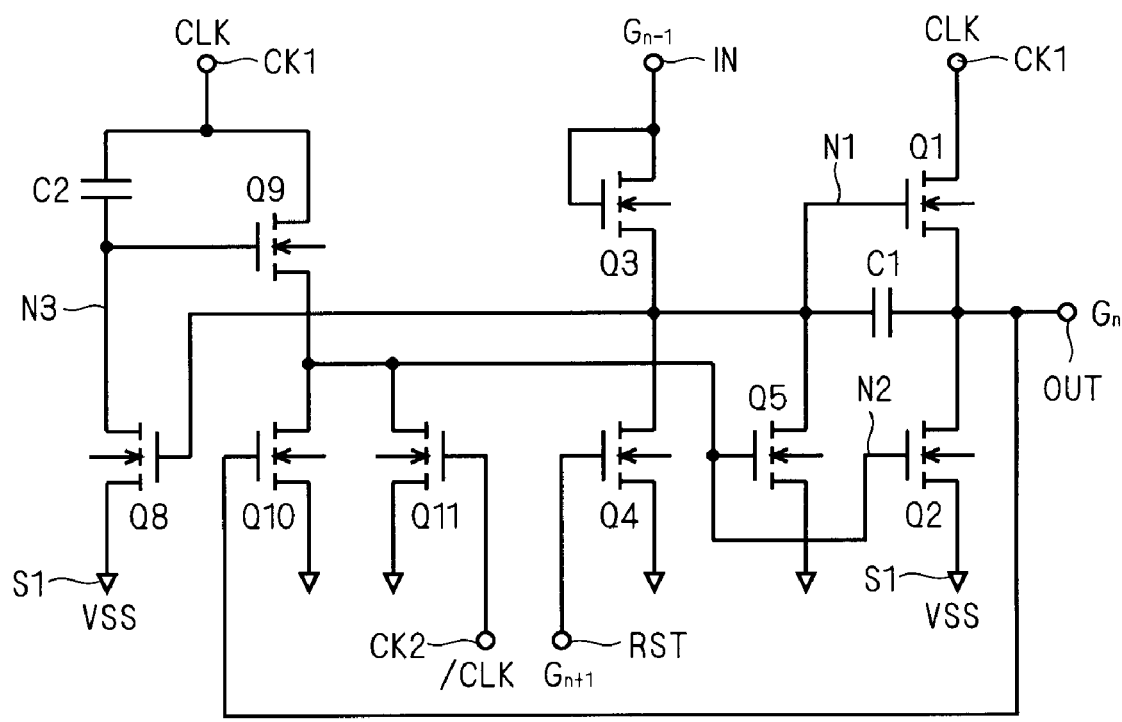
F I G . 1 0

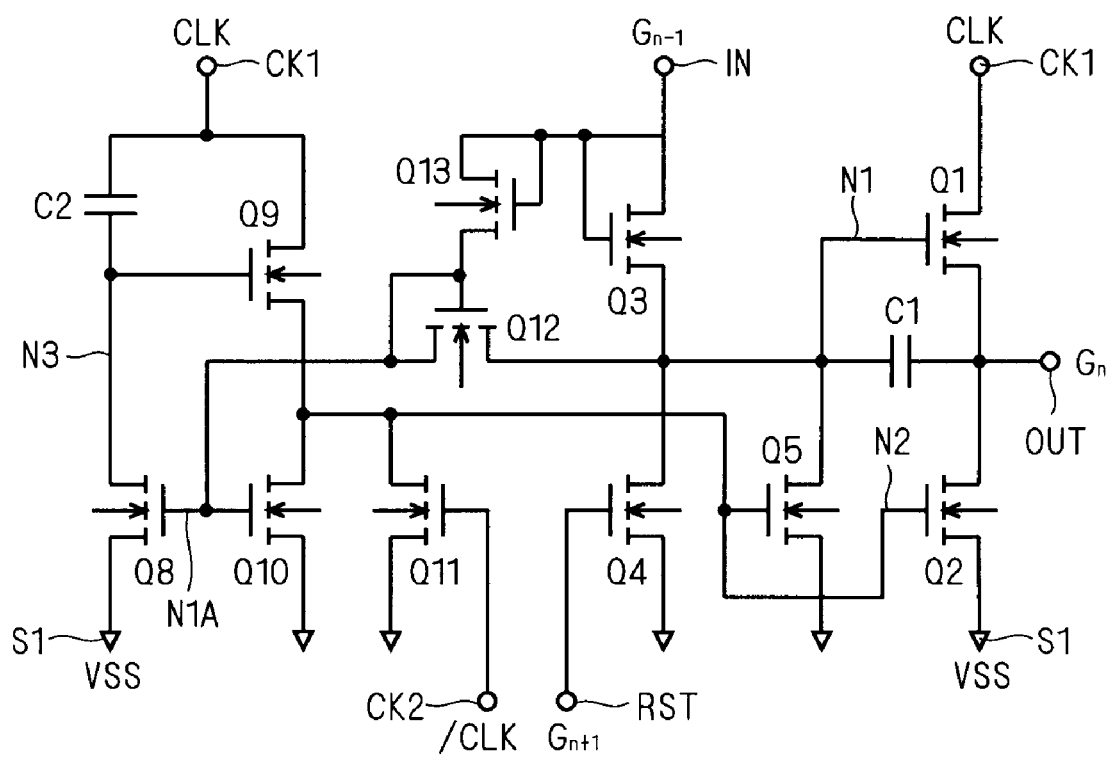
F I G . 1 1

F I G . 1 3
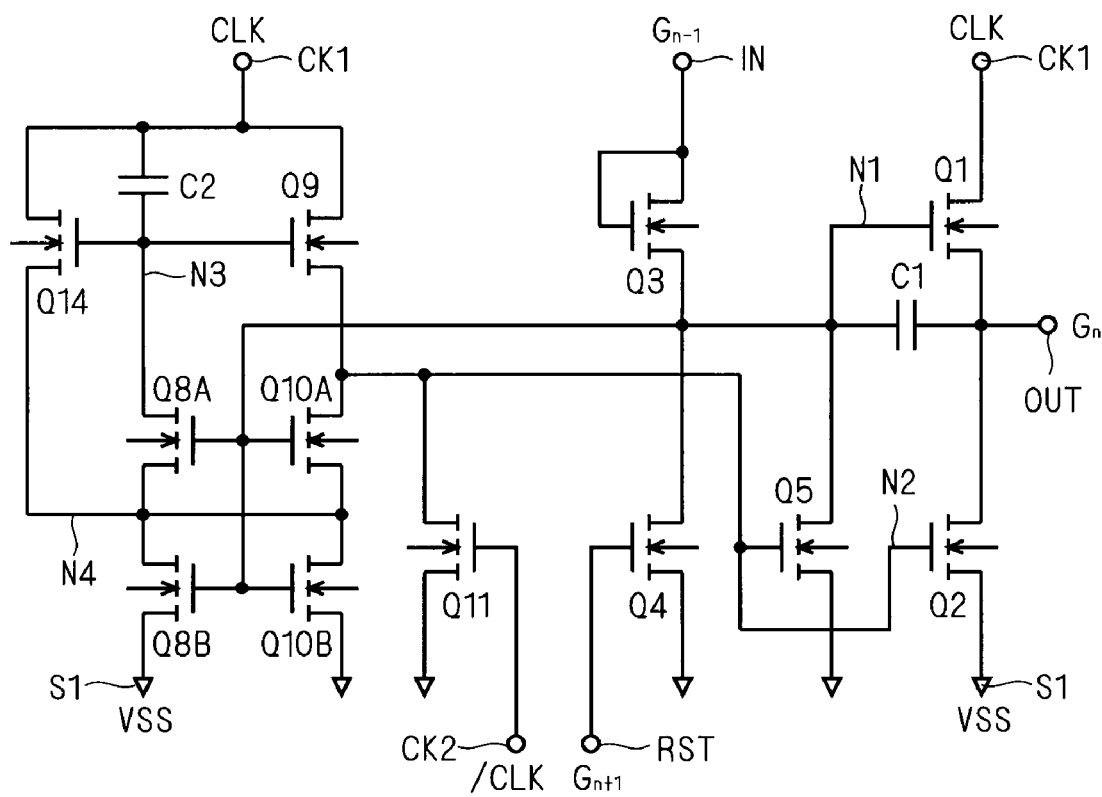

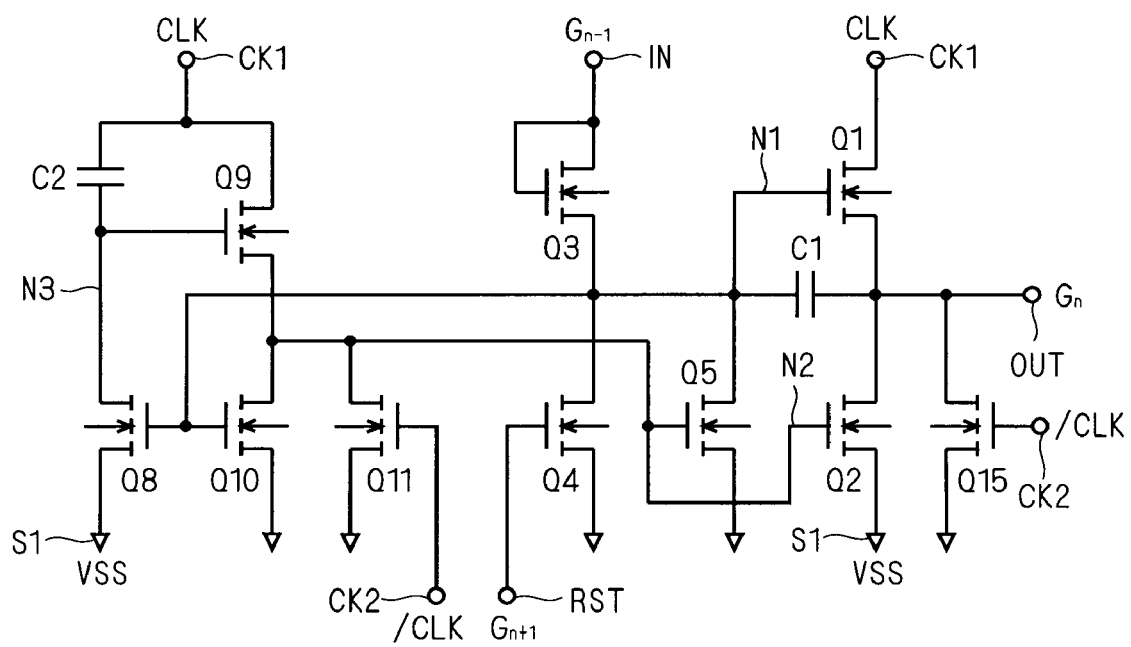
F I G . 1 4

F I G . 1 5
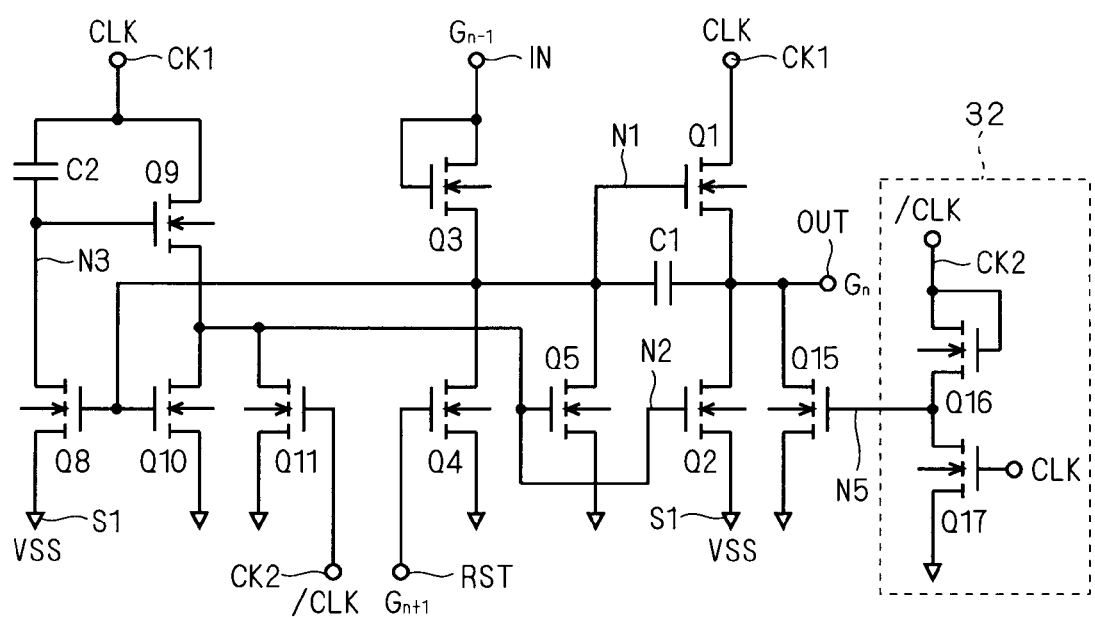

F I G . 1 6 A
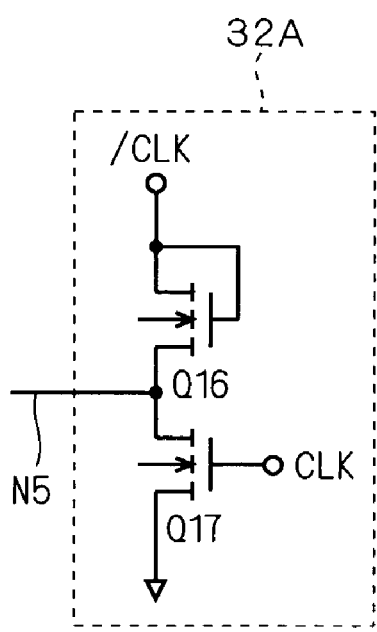
F I G . 1 6 B
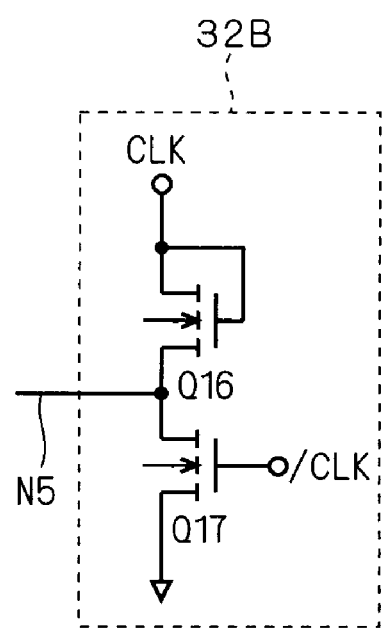

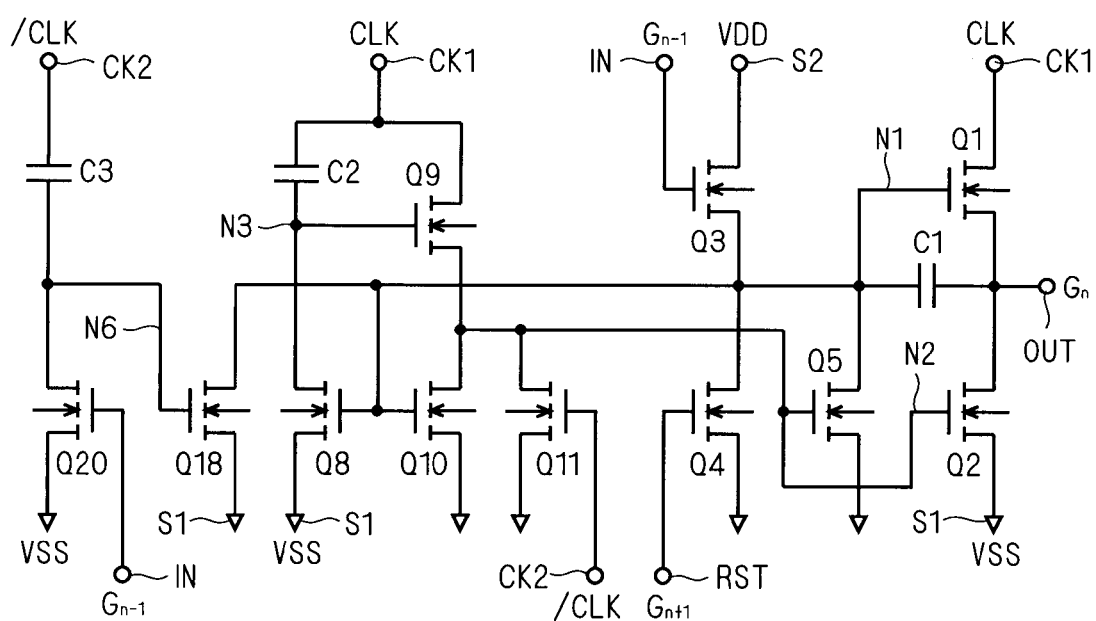
F I G . 2 3

F I G . 2 4
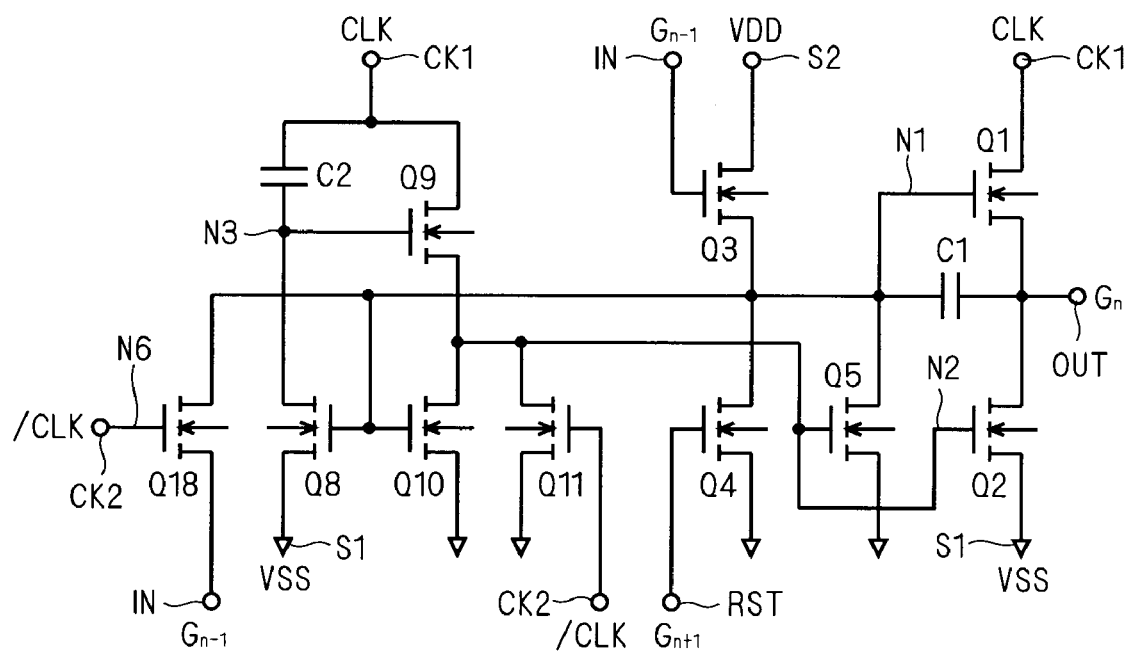

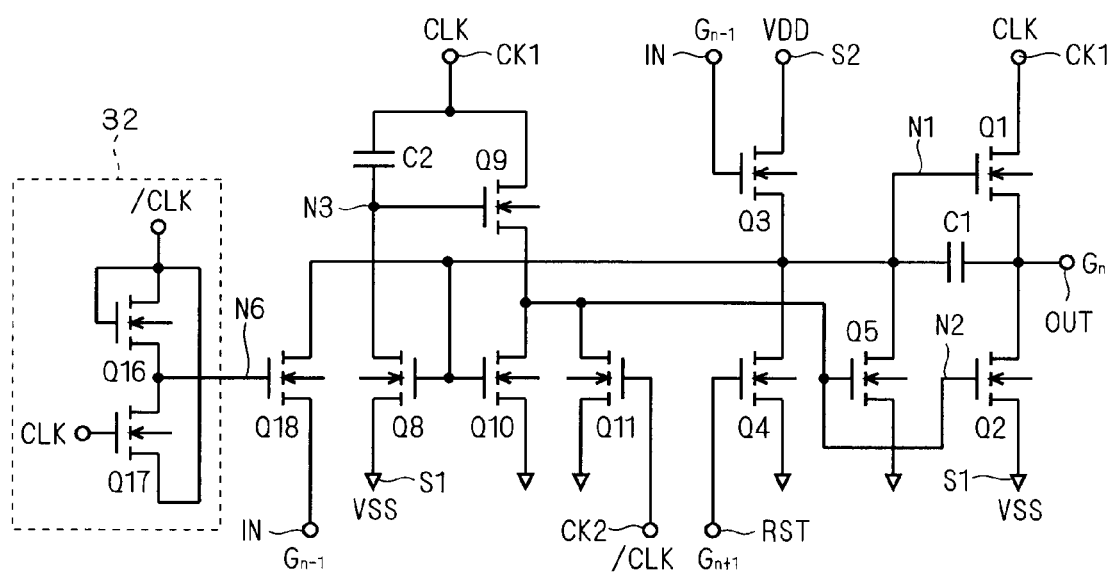
F I G . 2 5

F I G . 2 6
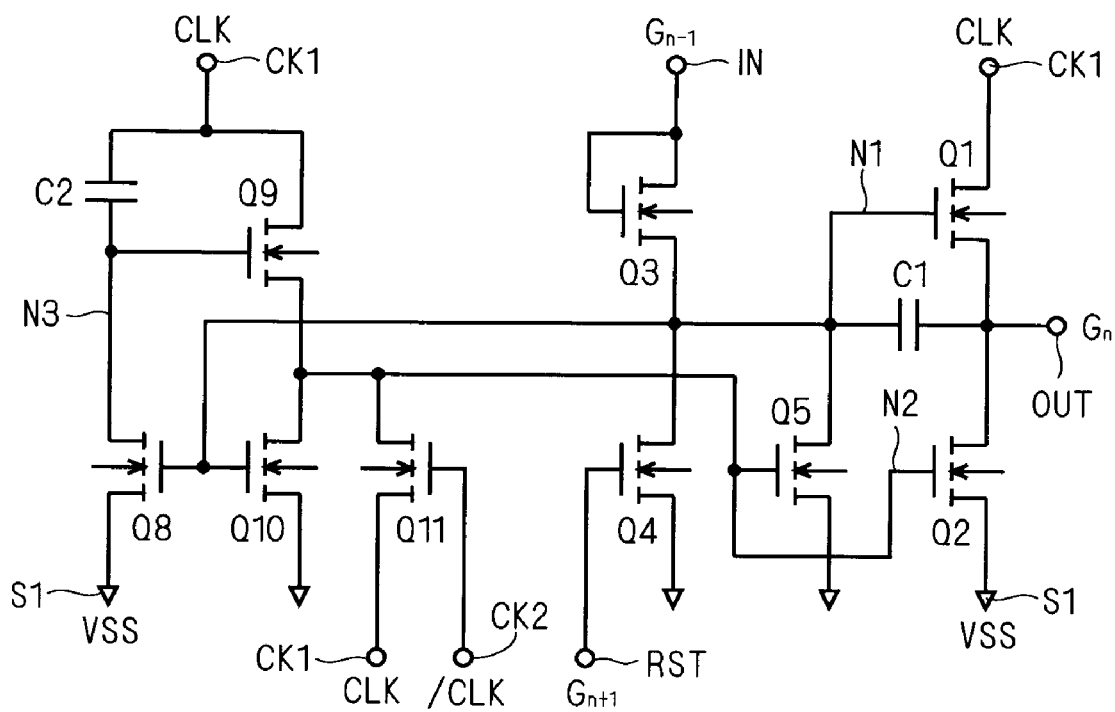

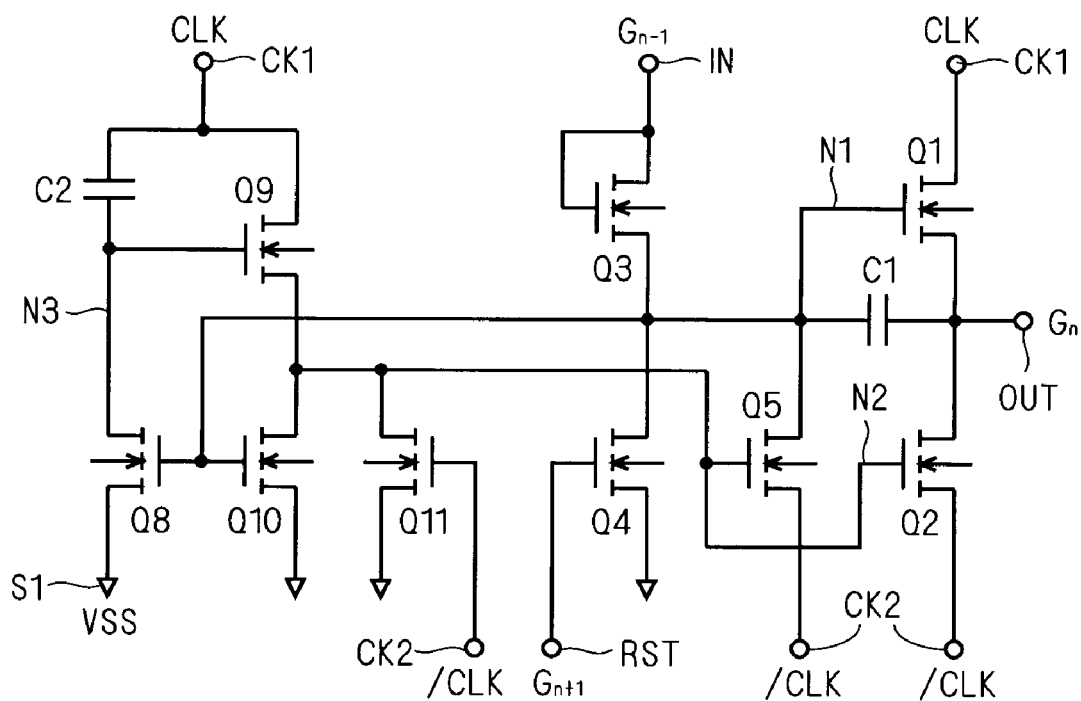
F I G . 2 7

SHIFT REGISTER AND IMAGE DISPLAY APPARATUS CONTAINING THE SAME

BACKGROUND OF THE INVENTION

1. Field of the Invention

The present invention relates to a shift register, and more particularly, to a shift register for use as a scanning-line driving circuit for an image display apparatus or the like, which is formed by field effect transistors of the same conductivity type only.

2. Description of the Background Art

An image display apparatus (hereinafter referred to as a "display apparatus") such as a liquid crystal display includes a display panel with a plurality of pixels arrayed in a matrix. A gate line (scanning line) is provided for each row of pixels (pixel line), and gate lines are sequentially selected and driven in a cycle of one horizontal period of a display signal, so that a displayed image is updated. As a gate-line driving circuit (scanning-line driving circuit) for sequentially selecting and driving pixel lines, i.e., gate lines, a shift register for performing a shift operation that makes a round in one frame period of a display signal can be used.

To reduce the number of steps in the manufacturing process of a display apparatus, such shift register used as the gate-line driving circuit is preferably formed by field effect transistors of the same conductivity type only. Accordingly, various types of shift registers formed by N- or P-type field effect transistors only and display apparatus containing such shift registers have been proposed (e.g., Japanese Patent Application Laid-Open Nos. 2004-246358 and 2006-24350). As a field effect transistor, a metal-oxide-semiconductor (MOS) transistor, a thin film transistor (TFT), or the like is used.

A shift register used for the gate-line driving circuit is formed of a plurality of shift registers provided for each pixel line, i.e., each gate line connected in cascade (cascade-connected). For ease of description, each of a plurality of shift registers constituting the gate-line driving circuit will be called "a unit shift register" throughout the present specification.

A typical unit shift register includes, in the output stage, an output pull-up transistor (pull-up MOS transistor Q1) connected between an output terminal (first gate voltage signal terminal GOUT in the aforementioned JP2004-246358) and a clock terminal (first power clock CKV) and an output pull-down transistor (pull-down MOS transistor Q2) connected between the output terminal and a reference voltage terminal (gate-off voltage terminal VOFF).

In such shift register, the output pull-up transistor is turned on and the output pull-down transistor is turned off in response to a predetermined input signal (output signal GOUT [N−1] from a preceding stage), and a clock signal input to the clock terminal in this mode is transmitted to the output terminal, and an output signal is then output. During a period in which the above-mentioned input signal is not input, the output pull-up transistor turns off and the output pull-down transistor turns on, so that the voltage level (hereinafter briefly called "level") at the output terminal is kept at the L (low) level.

A display apparatus employing amorphous silicon TFTs (a-Si TFTs) as shift registers of a gate-line driving circuit easily achieves large-area display with great productivity, and is widely used as the screen of a notebook PC, a large-screen display apparatus, etc.

Conversely, an a-Si TFT tends to have its threshold voltage shifted in the positive direction when the gate electrode is continuously positive-biased (dc-biased), resulting in degraded driving capability (current-flowing capability). Particularly, a shift register of a gate-line driving circuit carries out an operation of positively dc-biasing the gate of the output pull-down transistor for about one frame period (about 16 ms), during which the output pull-down transistor is degraded in driving capability. Then, the output pull-down transistor cannot discharge unnecessary charges if supplied to the output terminal resulting from noise or the like, disadvantageously resulting in a malfunction of erroneous activation of gate lines. It has been found that similar problems occurs in an organic TFT, not only in a-Si TFT.

The unit shift register disclosed in the aforementioned JP2004-246358 swings its gate-to-source voltage in a certain cycle during a period in which the output pull-down transistor is on. This prevents the gate of the output pull-down transistor from being dc-biased, minimizing the shift in threshold voltage (which may also be called "Vth shift") of the output pull-down transistor, which eliminates the aforementioned malfunction. To achieve such operation, the unit shift register disclosed in the aforementioned JP2004-246358 swings an output voltage of a power supply which charges the gate of the output pull-down transistor in a certain cycle.

A control device for a general-purpose gate-line driving circuit having conventionally been used (hereinafter referred to as "a driving control device") does not have a power supply output that swings in a certain cycle. Therefore, a driving control unit meeting special specifications is necessary in order to achieve the technique disclosed in the aforementioned JP2004-246358, which arises concern for increased costs.

The aforementioned JP2006-24350 discloses a technique for minimizing the Vth shift of an output pull-down transistor (TdA) and the Vth shift of a transistor (T1A) which pulls down the gate electrode of an output pull-up transistor (Tu) in a unit shift register shown in FIG. 7. More specifically, a capacitive element (C2) is connected between a gate electrode node (Y) of these two pull-down transistors (TdA, T1A) and a clock terminal (CK1), and the voltage at the gate electrode node (Y) in a non-selected state of the shift register is swung by the coupling through the capacitive element (C2) in accordance with the level transition of clock signals. With this technique, the threshold voltage of the two pull-down transistors (TdA, T1A) finally comes close to an intermediate value between the H and L levels of the gate electrode node (Y) (when the clock signals have a duty ratio of 50%).

To increase the display quality of a display device, it is preferable that the gate line be stable in voltage in the non-selected state. It is therefore preferable that the resistance at the output node (output resistance) of the shift register connected to the gate line be low. The on-state resistance of the output pull-down transistor (TdA) is determined by the difference between its threshold voltage and H level of the gate electrode node (Y). In other words, as the difference between the threshold voltage and H level of the gate electrode node (Y) increases, the driving capability (current driving capability) of a transistor increases and the output resistance decreases.

In FIG. 7 of the aforementioned JP2006-24350, the potential at the H level of the gate electrode node (Y) of the output pull-down transistor (TdA) is determined by the relationship between the parasitic capacitance at the gate electrode node and the coupling capacitance of the aforementioned capacitive element (C2). As the parasitic capacitance decreases relative to the coupling capacitance, the potential at the H level can be increased. However, the output pull-down transistor (TdA) needs to have a certain channel width or larger in order to pull down the output terminal (OUT) with a low resistance, and the gate electrode node (Y) has a large parasitic capacitance. Therefore, to increase the potential at the H level of the gate electrode node (Y), the capacitive element (C2) needs to have a large capacitance, which, however, in turn increases the circuit area.

SUMMARY OF THE INVENTION

An object of the present invention is to control an increase in circuit area of a shift register while preventing malfunctions without using any special driving control device, thereby achieving improved driving reliability.

According to the present invention, the shift register includes an input terminal, an output terminal, a reset terminal and a first clock terminal, first to fifth transistors, first inverter circuit and a first buffer circuit. The first transistor is configured to supply a first clock signal received at the first clock terminal to the output terminal. The second transistor is configured to discharge the output terminal. The third transistor has a control electrode connected to the input terminal and is configured to charge a first node connected to a control electrode of the first transistor. The fourth transistor has a control electrode connected to the reset terminal and is configured to discharge the first node. The fifth transistor has a control electrode connected to a predetermined second node and is configured to discharge the first node. In the first inverter circuit, the first node serves as an input node. The first buffer circuit is configured to receive an output from the first inverter circuit and output a signal to the second node.

Since the output from the first inverter circuit is supplied to the second node through the first buffer circuit, a voltage of large amplitude is supplied to the second node at high speeds, thus allowing the output resistance of the shift register to be reduced. The buffer circuit has a large driving capability with a relatively small circuit area, thus preventing an increase in circuit area. Further, it is unnecessary to use a special signal different from a conventional one to drive the shift register.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a block diagram illustrating an exemplary configuration of a gate-line driving circuit using unit shift registers according to the present invention;

FIG. 3 is a circuit diagram illustrating the configuration of a conventional unit shift register;

FIG. 5 is a block diagram illustrating another exemplary configuration of a gate-line driving circuit using unit shift registers according to the present invention;

FIG. 9 is a timing chart of an operation of the unit shift register according to the first preferred embodiment;

FIG. 10 is a circuit diagram illustrating the configuration of a unit shift register according to a second preferred embodiment of the present invention;

FIG. 11 is a circuit diagram illustrating the configuration of a unit shift register according to a third preferred embodiment of the present invention;

FIG. 13 is a circuit diagram illustrating the configuration of a unit shift register according to a modification of the fourth preferred embodiment;

FIG. 14 is a circuit diagram illustrating the configuration of a unit shift register according to a fifth preferred embodiment of the present invention;

FIG. 15 is a circuit diagram illustrating the configuration of a unit shift register according to a sixth preferred embodiment of the present invention;

FIGS. 16A and 16B are circuit diagrams respectively illustrating the configurations of clock conversion circuits according to the sixth preferred embodiment;

FIG. 23 is a circuit diagram illustrating the configuration of a unit shift register according to a tenth preferred embodiment of the present invention;

FIG. 24 is a circuit diagram illustrating the configuration of a unit shift register according to an eleventh preferred embodiment of the present invention;

FIG. 25 is a circuit diagram illustrating the configuration of a unit shift register according to a modification of the eleventh preferred embodiment;

FIG. 26 is a circuit diagram illustrating the configuration of a unit shift register according to a twelfth preferred embodiment of the present invention;

FIG. 27 is a circuit diagram illustrating the configuration of a unit shift register according to a thirteenth preferred embodiment of the present invention;

DESCRIPTION OF THE PREFERRED EMBODIMENTS

Figure 1:
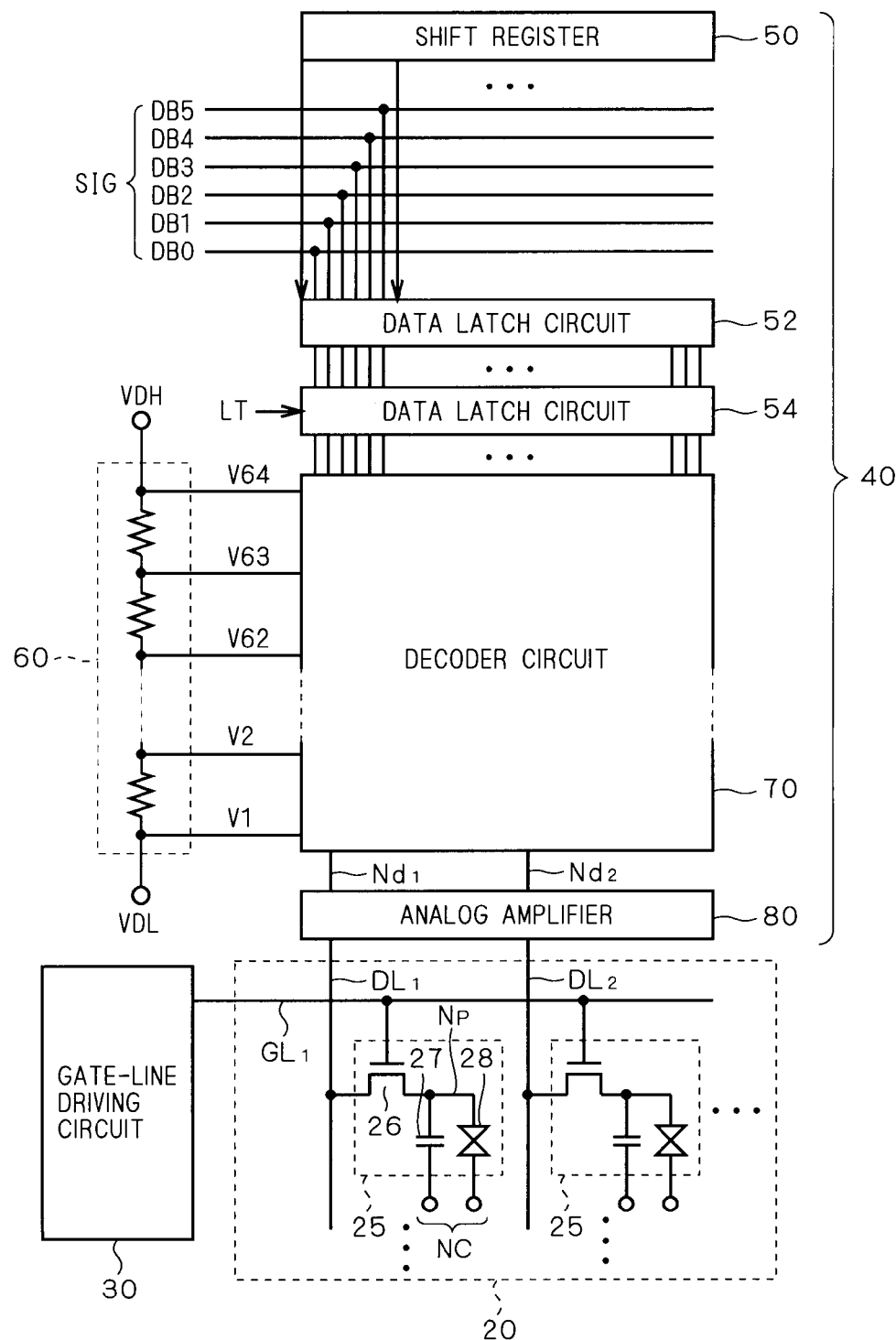
FIG. 1 is a schematic block diagram illustrating the configuration of a display apparatus according to the present invention.

Preferred embodiments of the present invention will be described hereinbelow referring to the accompanied drawings. To avoid repeated and redundant description, elements having the same or equivalent functions are indicated by the same reference characters in the drawings.

First Preferred Embodiment

FIG. 1 is a schematic block diagram illustrating the configuration of a display apparatus according to the present invention. The overall configuration of a liquid crystal display 10 is shown as an representative example of the display apparatus.

The liquid crystal display 10 is provided with a liquid crystal array part 20, a gate-line driving circuit (scanning-line driving circuit) 30 and a source driver 40. As will become apparent from the following description, a shift register according to the present invention is mounted on the gate-line driving circuit 30.

The liquid crystal array part 20 includes a plurality of pixels 25 arrayed in a matrix. The columns of pixels (hereinafter also referred to as "pixel lines") are respectively provided with gate lines $GL_1$, $GL_2$, . . . (hereinafter also generically referred to as a "gate line GL"), and the rows of pixels (hereinafter also referred to as "pixel rows") are respectively provided with data lines $DL_1$, $DL_2$, . . . (hereinafter generically referred to as a "data line DL"). FIG. 1 representatively shows pixels 25 of the first and second rows in the first column and corresponding gate line $GL_1$ and data lines $DL_1$ and $DL_2$.

Each pixel 25 has a pixel switching device 26 disposed between a corresponding data line DL and a pixel node Np, and a capacitor 27 and a liquid crystal display device 28 connected in parallel between the pixel node Np and a common electrode node NC. The crystal orientation in the liquid crystal display device 28 changes depending on the voltage difference between the pixel node Np and common electrode node NC, and in response to this change, the display luminance of the liquid crystal display device 28 changes. Accordingly, the luminance of each pixel 25 can be controlled by a display voltage transmitted to the pixel node Np through the data line DL and pixel switching device 26. In other words, an intermediate voltage difference between a voltage difference corresponding to the maximum luminance and a voltage difference corresponding to the minimum luminance is applied between the pixel node Np and common electrode node NC, so that an intermediate luminance can be obtained. Therefore, by setting display voltages stepwise, gray scale luminance can be obtained.

The gate-line driving circuit 30 sequentially selects and drives a gate line GL in a predetermined scanning cycle. Each pixel switching device 26 has its gate electrode connected to a corresponding gate line GL. While a certain gate line GL is selected, the pixel switching device 26 is brought into the conducting state in each pixel 25 connected to the selected gate line GL, whereby the pixel node Np is connected to a corresponding data line DL. Then, the display voltage transmitted to the pixel node Np is held by the capacitor 27. Generally, the pixel switching device 26 is constructed from a TFT formed on a substrate of the same insulator as the liquid crystal display device 28 (a glass substrate, a resin substrate or the like).

The source driver 40 is intended to output display voltages set stepwise by a display signal SIG which is an N-bit digital signal, to the data lines DL. As an example, the display signal SIG is assumed to be a 6-bit signal containing display signal bits DB0 to DB5. With such 6-bit display signal SIG, $2^6=64$ levels of gray can be displayed in each pixel 25. Further, a display of approximately 260 thousand colors can be achieved by forming one color display unit by three pixels of R (Red), G (Green) and B (Blue).

As shown in FIG. 1, the source driver 40 includes a shift register 50, data latch circuits 52, 54, a gradation voltage generating circuit 60, a decoder circuit 70 and an analog amplifier 80.

In the display signal SIG, the display signal bits DB0 to DB5 corresponding to the display luminance of respective pixels 25 are serially generated. In other words, each of the display signal bits DB0 to DB5 with each timing indicates the display luminance of any one pixel 25 in the liquid crystal array part 20.

The shift register 50 gives an instruction to the data latch circuit 52 to capture the display signal bits DB0 to DB5 in synchronization with timing when the settings of the display signal SIG are changed. The data latch circuit 52 sequentially captures serially-generated display signals SIG to latch display signals SIG for one pixel line.

A latch signal LT input to the data latch circuit 54 is activated with timing when display signals SIG for one pixel line are captured by the data latch circuit 52. In response to this, the data latch circuit 54 captures the display signals SIG for one pixel line latched by the data latch circuit 52 at that time.

The gradation voltage generating circuit 60 is formed by 63 resistor dividers connected in series between a high voltage VDH and a low voltage VDL, for generating 64 levels of gradation voltages V1 to V64, respectively.

The decoder circuit 70 decodes display signals SIG latched by the data latch circuit 54, and based on the result of decoding, selects voltages to be respectively output to decoder output nodes $Nd_1$, $Nd_2$, . . . (generically referred to as a "decoder output node Nd") from among the gradation voltages V1 to V64, and outputs the selected voltages.

As a result, display voltages (selected from among the gradation voltages V1 to V64) corresponding to the display signals SIG for one pixel line latched by the data latch circuit 54 are output to the decoder output node Nd at the same time (in parallel). FIG. 1 representatively shows the decoder output nodes $Nd_1$ and $Nd_2$ corresponding to the data line $DL_1$ of the first row and the data line $DL_2$ of the second row, respectively.

The analog amplifier 80 outputs analog voltages corresponding to the display voltages output from the decoder circuit 70 to the decoder output nodes $Nd_1$, $Nd_2$, . . . , to the data lines $DL_1$, $DL_2$, . . . , respectively.

The source driver 40 repeatedly outputs the display voltages corresponding to a series of display signals SIG for one pixel line to the data line DL in a predetermined scanning cycle, and the gate-line driving circuit 30 sequentially drives the gate lines $GL_1$, $GL_2$, . . . in synchronization with the scanning cycle. Accordingly, image display based on the display signals SIG is provided on the liquid crystal array part 20.

While FIG. 1 shows an example of the liquid crystal display 10 with the gate-line driving circuit 30 and source driver 40 formed integrally with the liquid crystal array part 20, the source driver 40 may be provided as an external circuit of the liquid crystal array part 20.

FIG. 2 shows the configuration of the gate-line driving circuit 30. The gate-line driving circuit 30 includes a plurality of unit shift registers $SR_1$, $SR_2$, $SR_3$, $SR_4$, . . . connected in cascade (hereinafter, the unit shift registers $SR_1$, $SR_2$, . . . will generically be called a "unit shift register SR"). The unit shift register SR is provided one each for one pixel line, i.e., one gate line GL.

A clock generator 31 shown in FIG. 2 is intended to input three phase clock signals CLK1, CLK2 and CLK3, shifted in phase with one another, to the unit shift register SR of the gate-line driving circuit 30. These clock signals CLK1, CLK2 and CLK3 are controlled to be sequentially activated with timing synchronized with the scanning cycle of the display apparatus.

Each unit shift register SR includes an input terminal IN, an output terminal OUT, a first clock terminal CK1 and a reset terminal RST. As shown in FIG. 2, either one of the clock signals CLK1, CLK2 and CLK3 output from the clock generator 31 is supplied to the first clock terminal CK1 and reset terminal RST of each unit shift register SR. The unit shift register SR has its output terminal OUT connected to a gate line GL. That is, a signal output from the output terminal OUT is a horizontal (or vertical) scanning pulse for activating the gate line GL.

A start pulse SP corresponding to the head of each frame period of an image signal is input to the input terminal IN of the unit shift register $SR_1$ of the first stage. To the input terminal IN of each of the unit shift registers SR of the second and subsequent stages, an output signal from the immediately preceding stage is input. In other words, the input terminal IN of the unit shift register SR of the second or subsequent stage is connected to the output terminal OUT of the unit shift register SR of the immediately preceding stage.

In the gate-line driving circuit 30 of such configuration, each unit shift register SR transmits an input signal received from the immediately preceding stage (output signal from the immediately preceding stage) to a corresponding gate line GL and to a unit shift register SR of the immediately succeeding stage while shifting the input signal in synchronization with the clock signals CLK1, CLK2 and CLK3 (operation of the unit shift register SR will be described later in detail). As a result, a series of unit shift registers SR serve as what is called a gate-line driving unit for sequentially activating gate lines GL with timing based on the predetermined scanning cycle.

For ease of description of the present invention, a conventional unit shift register will now be described. FIG. 3 is a circuit diagram illustrating the configuration of the conventional unit shift register SR. In the gate-line driving circuit 30, the respective unit shift registers SR connected in cascade have substantially the same configuration. The configuration of one unit shift register SR will thus be described below as a representative example. Transistors constituting the unit shift register SR are all field effect transistors of the same conductivity type, and are all assumed to be N-type TFTs herein.

As shown in FIG. 3, the conventional unit shift register SR includes a first power terminal S1 supplied with a low supply voltage VSS and a second power terminal S2 supplied with a high supply voltage VDD, in addition to the input terminal IN, output terminal OUT, first clock terminal CK1 and reset terminal RST already shown in FIG. 2. In the following description, the low supply voltage VSS will be defined as a reference potential of the circuit (=0V); in practical use, however, a reference potential is determined with reference to a voltage of data written into pixels. For example, the high supply voltage VDD may be set at 17V, and the low supply voltage VSS may be set at −12V.

The output stage of the unit shift register SR includes a transistor Q1 connected between the output terminal OUT and first clock terminal CK1 and a transistor Q2 connected between the output terminal OUT and first power terminal S1. Hereinafter, a node connected to the gate (control electrode) of the transistor Q1 will be referred to as a "node N1", and a node connected to the gate of the transistor Q2 will be referred to as a "node N2".

A capacitive element C1 is provided between the gate and source of the transistor Q1 (i.e., between the output terminal OUT and node N1). A diode-connected transistor Q3 is connected between the node N1 and input terminal IN. Transistors Q4 and Q5 are connected between the node N1 and first power terminal S1. The transistor Q4 has its gate connected to the reset terminal RST, and the transistor Q5 has its gate connected to the node N2.

A diode-connected transistor Q6 is connected between the node N2 and second power terminal S2. A transistor Q7 is connected between the node N2 and first power terminal S1, and has its gate connected to the node N1. The transistor Q7 is set to have a driving capability (current flowing capability) sufficiently higher than that of the transistor Q6. In other words, the transistor Q7 has an on-state resistance lower than that of the transistor Q6. Accordingly, as the gate of the transistor Q7 rises in level, the node N2 drops in level; conversely, as the gate of the transistor Q7 drops in level, the node N2 rises in level. That is, the transistors Q6 and Q7 constitute an inverter in which the node N1 serves as an input node and the node N2 serves as an output node. The inverter whose operation is defined by the ratio between the on-state resistances of the transistors Q6 and Q7 is called "a ratio inverter". This inverter serves as a "pull-down driving circuit" which drives the transistor Q2 for pulling down the output terminal OUT.

A specific operation of the unit shift register SR shown in FIG. 3 will now be described. Since the respective unit shift registers SR constituting the gate-line driving circuit 30 operate substantially in the same manner, the operation of a unit shift register $SR_n$ of the n-th stage will be described as a representative example.

For ease of description, it is assumed that the first clock terminal CK1 of the unit shift register $SR_n$ receives the clock signal CLK1 and the reset terminal RST receives the clock signal CLK3. This case corresponds to, e.g., the unit shift registers $SR_1$ and $SR_4$ shown in FIG. 2. Further, the potential of the clock signals CLK1, CLK2 and CLK3 at the H (High) level is assumed to be the high supply voltage VDD, and the potential of the these clock signals at the L (Low) level is assumed to be the low supply voltage VSS. Threshold voltages of respective transistors constituting the unit shift register SR are all assumed to have the same value, Vth. An output signal G from a shift register $SR_i$ of the i-th stage will be indicated by a reference character $G_i$.

In the initial state, it is assumed that the node N1 is at the L level (VSS). Hereinafter, this state will be called a "reset mode". In the unit shift register SR shown in FIG. 3, the node N2 is at the H level (VDD−Vth) when the node N1 is at the L level. It is also assumed that the first clock terminal CK1 (clock signal CLK1), reset terminal RST (clock signal CLK3) and input terminal IN (output signal $G_{n-1}$ from the immediately preceding stage) are all at the L level. In this reset mode, the transistor Q1 is off (cut-off state) and the transistor Q2 is on (conducting state). Accordingly, the output terminal OUT (output signal $G_n$) is kept at the L level regardless of the level at the first clock terminal CK1 (clock signal CLK1). That is, the gate line $GL_n$ connected to this unit shift register $SR_n$ is in the non-selected state.

Starting from this mode, when the output signal $G_{n-1}$ from the immediately preceding stage (or the start pulse SP in the first stage) input to the input terminal IN of the unit shift register $SR_n$ rises to the H level, the transistor Q3 turns on. At this time, the node N2 is at the H level, and thus, the transistor Q5 is also on, but the node N1 rises in level because the transistor Q3 is set to have a driving capability sufficiently higher than that of the transistor Q5 and have an on-state resistance sufficiently lower than that of the transistor Q5.

The transistor Q7 thereby starts conducting, causing the node N2 to drop in level. Then, the transistor Q5 increases in resistance, causing the node N1 to rapidly rise in level to sufficiently turn on the transistor Q7. As a result, the node N2 reaches the L level (VSS), the transistor Q5 turns off, and the node N1 reaches the H level (VDD−Vth). In such mode where the node N1 is at the H level (hereinafter this mode will be called a "set mode"), the node N2 reaches the L level, so that the transistor Q1 is on, and the transistor Q2 is off. Thereafter, the output signal $G_{n-1}$ from the immediately preceding stage returns to the L level, but the transistor Q3 turns off, which maintains the node N1 in a floating state (with high impedance) at the H level, whereby the set mode is maintained.

In the set mode, the transistor Q1 is on and the transistor Q2 is off. Thus, when the clock signal CLK1 input to the first clock terminal CK1 subsequently rises to the H level, the output terminal OUT rises in level. At this time, the node N1 is stepped up by a certain voltage by means of a coupling through the capacitive element C1 and gate-to-channel capacitance of the transistor Q1 (therefore, the node N1 may also be called "a stepped-up node").

Accordingly, the gate-to-source voltage of the transistor Q1 is maintained higher than the threshold voltage (Vth) even when the output terminal OUT rises in level, so that the transistor Q1 is kept at a low impedance. This allows the output signal $G_n$ to quickly vary in level along with the level of the clock signal CLK1. Further, when the gate-to-source voltage of the transistor Q1 is sufficiently high, the transistor Q1 operates in the non-saturated region (a non-saturation operation), causing no loss by the threshold voltage, which causes the output terminal OUT to rise to the same level as the clock signal CLK1. Accordingly, the output signal $G_n$ is at the H level for a period in which the clock signal CLK1 is at the H level, and activates the gate line $GL_n$ into the selected state. When the clock signal CLK1 returns to the L level, the output signal $G_n$ quickly returns to the L level following that, which causes the gate line $GL_n$ to be discharged to return to the non-selected state.

Thereafter, when the clock signal CLK3 input to the reset terminal RST rises to the H level, the transistor Q4 is turned on, whereby the reset mode is brought about again in which the node N1 is at the L level. Accordingly, the transistor Q7 turns off, and the node N2 rises to the H level. In other words, the unit shift register $SR_n$ returns to the above-described initial state.

Giving a summary of the above-described operation, the unit shift register $SR_n$ is in the reset mode unless a signal (start pulse SP or output signal $G_{n-1}$ from the immediately preceding stage) is input to the input terminal IN, and the transistor Q1 is kept off and the second transistor Q2 is kept on, so that the output terminal OUT (gate line $GL_n$) is kept at the L level (VSS) with low impedance. When a signal is input to the input terminal IN, the unit shift register $SR_n$ is switched into the set mode. Since the transistor Q1 is on and the second transistor Q2 is off in the set mode, the output signal $G_n$ is at the H level for a period in which the signal input to the first clock terminal CK1 (clock signal CLK1) is at the H level. Thereafter, when a signal (clock signal CLK3) is input to the reset terminal RST, the original reset mode is brought about.

Figure 4:
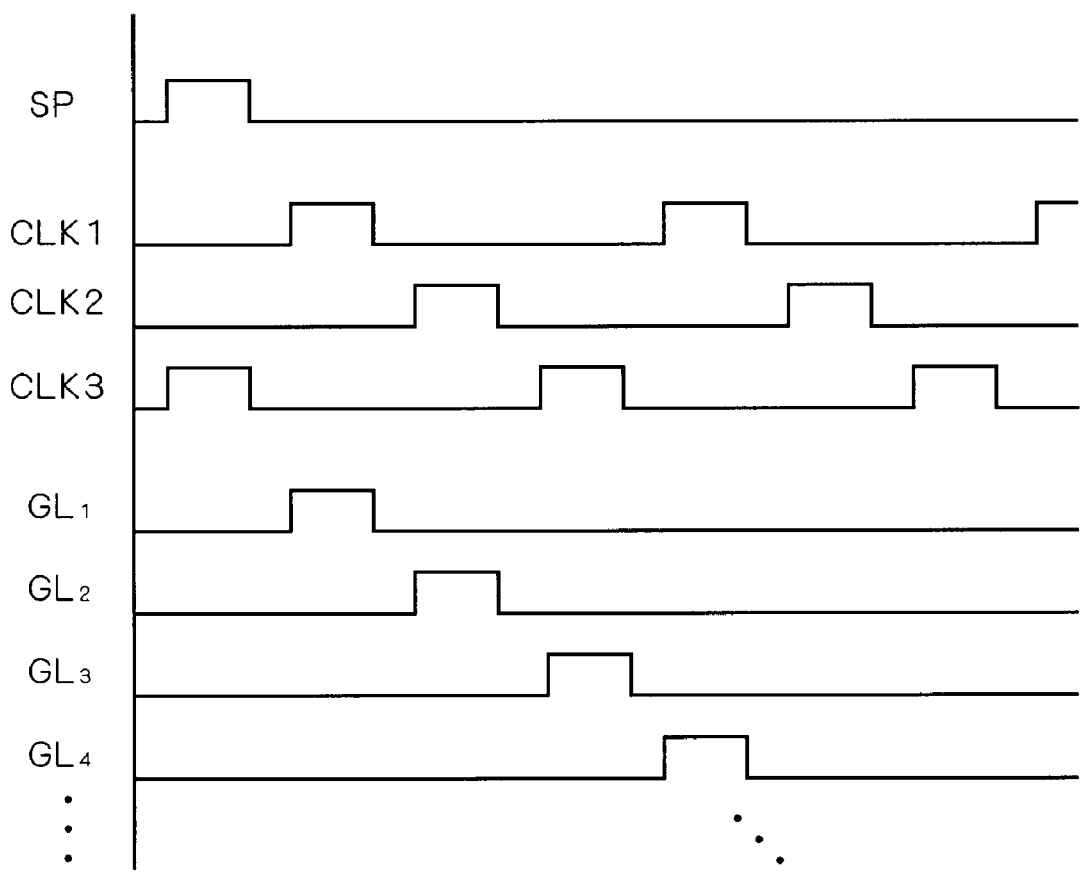
FIG. 4 is a timing chart of an operation of the gate-line driving circuit shown in FIG. 2.

With the multistage shift register (gate-line driving circuit 30) in which a plurality of unit shift registers SR each operating as described above are connected in cascade as shown in FIG. 2, the input of the start pulse SP to the unit shift register $SR_1$ of the first stage induces transmission of the output signal $G_n$ to unit shift registers $SR_2$, $SR_3$, . . . in sequence while being shifted with timing synchronized with the clock signals CLK1, CLK2 and CLK3 (cf. the timing chart of FIG. 4). The gate-line driving circuit 30 can thereby drive the gate lines $GL_1$, $GL_2$, $GL_3$, . . . in sequence in a predetermined scanning cycle.

While the above example shows the case in which the plurality of unit shift registers SR operate on the basis of three phase clock signals, two phase clock signals may be used instead. FIG. 5 illustrates the configuration of the gate-line driving circuit 30 in such case.

In this case, the gate-line driving circuit 30 is also formed of a plurality of unit shift registers SR connected in cascade. Specifically, each of the unit shift registers SR has its input terminal IN connected to the output terminal OUT of a unit shift register SR of the immediately preceding stage, except that the input terminal IN of the unit shift register $SR_1$ of the first stage receives a start pulse SP as an input signal.

The clock generator 31 in this case outputs two phase clock signals CLK and /CLK of opposite phases to each other (whose active periods do not coincide with each other). The clock signals CLK and /CLK are alternately input to the first clock terminal CK1 of the respective unit shift registers SR such that each unit shift register SR and its immediately succeeding unit shift register SR receive clock signals of opposite phases to each other. As shown in FIG. 5, each of the unit shift registers SR has its reset terminal RST connected to the output terminal OUT of a unit shift register SR of a succeeding stage (in this example, the immediately succeeding stage).

The operation of the unit shift register SR in the gate-line driving circuit 30 configured as shown in FIG. 5 will be described. The operation of the unit shift register $SR_n$ of the n-th stage will also be described herein as a representative example. For ease of description, it is assumed that the first clock terminal CK1 of the unit shift register $SR_n$ receives the clock signal CLK. This case corresponds to, e.g., the unit shift registers $SR_1$ and $SR_3$ shown in FIG. 5. The potential of the clock signals CLK and /CLK at the H level is assumed to be VDD, and the potential at the L level is assumed to be VSS.

In the initial state, the reset mode is assumed in which the node N1 is at the L level (VSS). At this time, the node N2 is at the H level (VDD−Vth). It is also assumed that the first clock terminal CK1 (clock signal CLK), reset terminal RST (output signal $G_{n+1}$ from the immediately succeeding stage) and input terminal IN (output signal $G_{n-1}$ from the immediately preceding stage) are all at the L level.

Starting from that mode, the output signal $G_{n-1}$ from the immediately preceding stage (start pulse SP in the case of the first stage), when raised to the H level, is input to the input terminal IN of the unit shift register $SR_n$ to turn on the transistor Q3, causing the node N1 to rise in level. The transistor Q7 thereby starts conducting, causing the node N2 to drop in level. Then, the transistor Q5 increases in resistance, causing the node N1 to rapidly rise in level, to sufficiently turn on the transistor Q7. The node N2 in turn reaches the L level (VSS) to turn off the transistor Q5, causing the node N1 to reach the H level (VDD−Vth). As a result, the set mode is brought about in which the transistor Q1 is on and the transistor Q2 is off.

Then, when the clock signal CLK rises to the H level and the output terminal OUT rises in level, the node N1 rises in level by a certain voltage by the coupling induced by the capacitive element C1 and gate-to-channel capacitance of the transistor Q1. Therefore, the output signal $G_n$ varies in level along with the level at the first clock terminal CK1. During a period in which the clock signal CLK is at the H level, the output signal $G_n$ is also at the H level, causing the gate line $GL_n$ to be activated (brought into the selected state). Thereafter, when the clock signal CLK returns to the L level, the output signal $G_n$ also returns to the L level, causing the gate line $GL_n$ to return to the non-selected state.

After the output signal $G_n$ is transmitted to the unit shift register $SR_{n+1}$, the output signal $G_{n+1}$ therefrom reaches the H level and is input to the reset terminal RST to turn on the transistor Q4, causing the node N1 to drop to the L level. The transistor Q7 accordingly turns off, causing the node N2 to rise to the H level. That is, the unit shift register $SR_n$ returns to the reset mode in which the transistor Q1 is off and the transistor Q2 is on.

As described, in the case of the gate-line driving circuit 30 configured as shown in FIG. 5, the operation of each of the unit shift registers SR is substantially the same as in the configuration as shown in FIG. 2 except that the reset terminal RST receives the output signal $G_{n+1}$ from the immediately succeeding stage.

With the multistage shift register (gate-line driving circuit 30) in which a plurality of unit shift registers SR each operating as described above are connected in cascade as shown in FIG. 5, the input of the start pulse SP to the unit shift register SR1 of the first stage induces transmission of the output signal G to unit shift registers $SR_2$, $SR_3$, . . . in sequence while being shifted with timing synchronized with the clock signals CLK and /CLK. The gate-line driving circuit 30 can thereby drive the gate lines $GL_1$, $GL_2$, $GL_3$, . . . in sequence in a predetermined scanning cycle.

Figure 6:
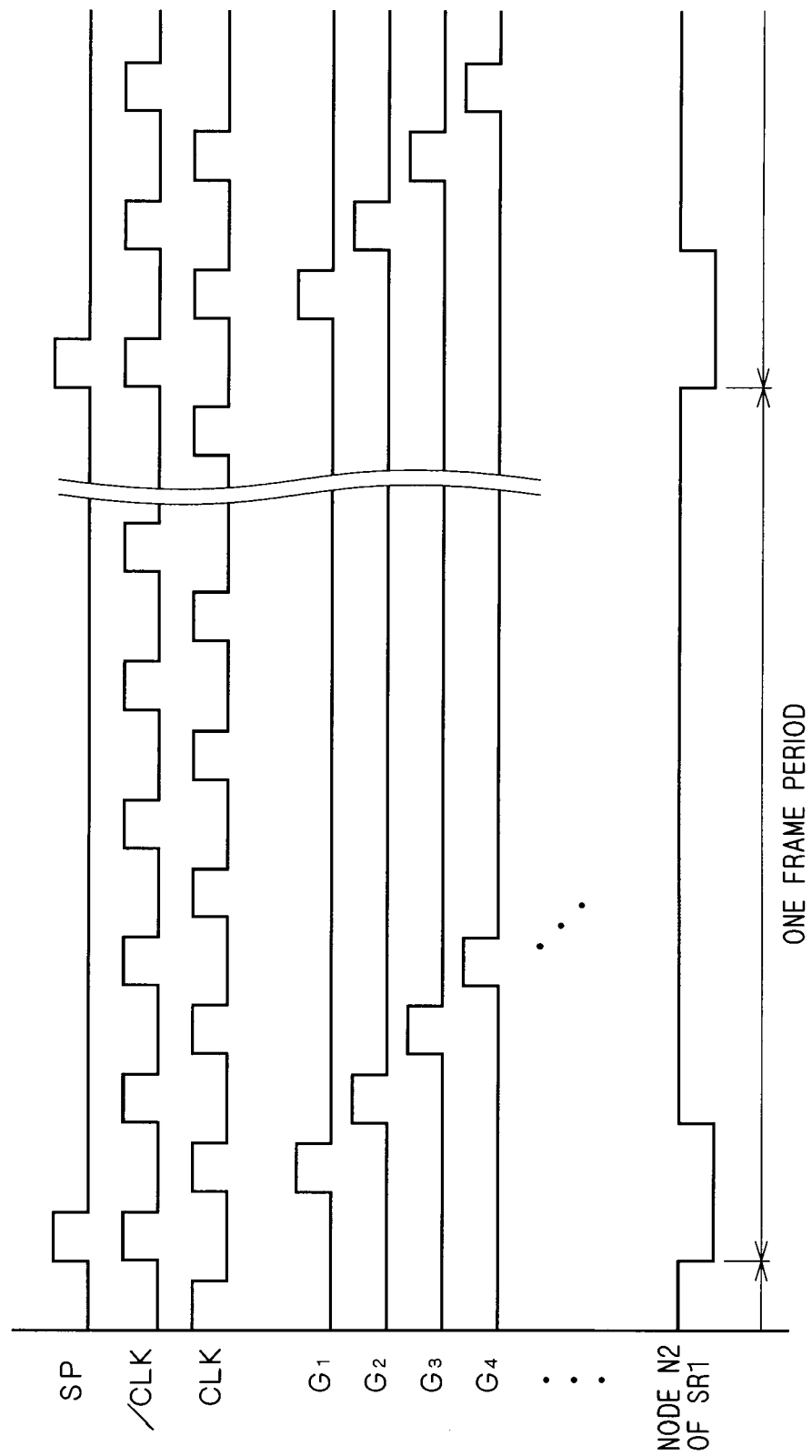
FIG. 6 is a timing chart of an operation of the gate-line driving circuit shown in FIG. 5.

In the configuration shown in FIG. 5, however, the reset terminal RST receives the output signal $G_{n+1}$ from the immediately succeeding stage. Accordingly, each of the unit shift registers SR returns to the reset mode (i.e., the above-described initial state) only after a unit shift register SR of the immediately succeeding stage is operated at least once. Each of the unit shift registers SR is not capable of carrying out the normal operation as shown in FIG. 6 unless it undergoes the reset mode. Therefore, the configuration shown in FIG. 5 requires a dummy operation, prior to the normal operation, to transmit a dummy input signal through the unit shift registers SR from the first to the last stages. Alternatively, a reset transistor may additionally be provided between the node N2 of each of the unit shift registers SR and second power terminal S2 (high supply voltage) to carry out a reset operation of forcefully charging the node N2 prior to the normal operation. In that case, however, a reset signal line is additionally required.

The aforementioned problem of malfunction of the conventional unit shift register SR will now be described in detail. In the following description, each transistor constituting the unit shift register SR is assumed to be an a-Si TFT.

The lowermost part of the timing chart of FIG. 6 shows voltage waveforms at the node N2 of the unit shift register SR, in the gate-line driving circuit 30 shown in FIG. 5. As described above, when a signal input to the input terminal IN (start pulse SP or output signal $G_{n-1}$ from the immediately preceding stage) rises to the H level, the node N2 drops to the L level, but immediately returns to the H level by a signal input to the reset terminal RST (output signal $G_{n+1}$ from the immediately succeeding stage) to be kept at the H level for about one frame period (about 16 ms) (although not shown, this behavior is also seen in the case of FIG. 2). That is, the gate of each of the transistors Q2 and Q5 is continuously positive-biased (dc-biased) for about one frame period. Accordingly, when the unit shift register SR is formed of a-Si TFTs, the threshold voltage of the transistors Q2 and Q5 is shifted in the positive direction, thus resulting in degraded driving capability.

When the transistor Q5 in the reset mode is degraded in driving capability, charges occurred at the node N1 due to the noise resulting from, for example, an overlap capacitance between the gate and source/drain of the transistor Q1, and the like cannot be discharged quickly, which may cause the node N1 to rise in level. In such case, the transistor Q1 in the off state decreases in resistance, causing charges to be unnecessarily supplied to the output terminal OUT when the clock signal CLK rises to the H level. Further, when the transistor Q2 has a degraded driving capability at this time, charges at the output terminal OUT occurred by the noise cannot be discharged quickly, causing the output terminal OUT to rise in level. That is, a malfunction that the gate line which should be in the non-selected state is brought into the selected state occurs, resulting in a display malfunction of the liquid crystal display 10.

As described earlier, these problems can be solved by using the driving method disclosed in the aforementioned JP2004-246358, which, however, requires a driving control unit meeting special specifications. Such driving control unit meeting special specifications is not necessary by applying the technique disclosed in the aforementioned JP2006-24350 to the transistor Q2 to swing the level at the node N2 with a clock signal using a capacitive element. However, a large capacitive element is required in order to sufficiently rises the potential at the node N2 because the transistor Q2 has a large gate width, which arises concern for increased circuit area. Hereinafter, a shift register according to the present invention capable of solving such problems will be described.

Figure 7:
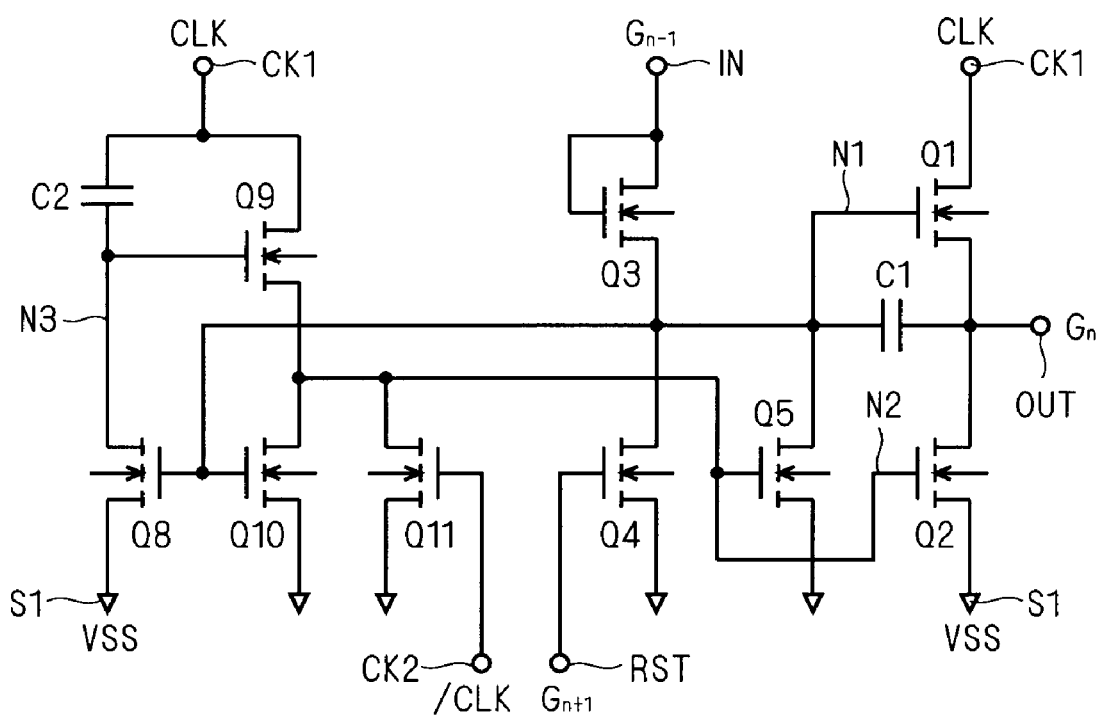
FIG. 7 is a circuit diagram illustrating the configuration of a unit shift register according to a first preferred embodiment of the present invention.

FIG. 7 is a circuit diagram illustrating the configuration of a unit shift register SR according to the first preferred embodiment of the present invention. In preferred embodiments which will be described hereinafter, transistors constituting the unit shift register SR are all field effect transistors of the same conductivity type only. In the following description, they are all assumed to be an N channel type transistor (N-type TFT). The N-type TFT is in the active (on) state when its gate is at the H level, and in the non-active (off) state at the L level. The present invention may be applied to a unit shift register SR formed of P-type transistors. The P-type transistor is in the active (on) state when its gate is at the L level, and in the non-active (off) state at the H level.

As shown in FIG. 7, the unit shift register SR includes the transistor Q1 connected between the output terminal OUT and first clock terminal CK1 and the transistor Q2 connected between the output terminal OUT and first power terminal S1.

That is, the transistor Q1 is intended to supply the clock signal input to the first clock terminal CK1 to the output terminal OUT, and the transistor Q2 is intended to supply the low supply voltage VSS to the output terminal OUT to discharge the output terminal OUT. Hereinafter, a node connected to the gate (control electrode) of the transistor Q1 will be referred to as the node N1, and the gate node of the transistor Q2 will be referred to as the node N2.

The capacitive element C1 is provided between the gate and source of the transistor Q1, i.e., between the node N1 and output terminal OUT. The capacitive element C1 is intended to increase the step-up effect at the node N1 following the rise in level at the output terminal OUT. However, the capacitive element C1 may be omitted and replaced by the gate-to-channel capacitance of the transistor Q1 when it is sufficiently large.

The transistor Q3 having its gate connected to the input terminal IN is connected between the node N1 and input terminal IN (that is, the transistor Q3 is diode-connected). The transistor Q4 having its gate connected to the reset terminal RST and the transistor Q5 having its gate connected to the gate of the transistor Q2 (node N2) are connected in parallel to each other between the node N1 and first power terminal S1. This configuration is similar to that of the conventional unit shift register SR shown in FIG. 3.

In the conventional unit shift register SR shown in FIG. 3, the inverter circuit (transistors Q7, Q8) in which the node N1 serves as the input node and the node N2 serves as the output node is used as the pull-down driving circuit for driving the transistor Q2 in order to pull down the output transistor Q2. The unit shift register SR according to the present embodiment includes a pull-down driving circuit of different configuration therefrom.

The pull-down driving circuit of the unit shift register SR according to the present embodiment includes an inverter circuit in which the node N1 serves as the input node and a buffer circuit receiving the output of the inverter circuit and outputting a signal improved in driving capability to the node N2. Referring to FIG. 7, the inverter circuit is formed of the capacitive element C2 and transistor Q8 connected in series between the first clock terminal CK1 and first power terminal S1. The transistor Q8 has its gate connected to the node N1 serving as the input node of the inverter circuit. The capacitive element C2 serves as a capacitive load, and the transistor Q8 serves as a driver element. The output node of the inverter circuit is a connection node (hereinafter referred to as a "node N3") between the capacitive element C2 and the transistor Q8. As is apparent from the above-described configuration, a clock signal input to the first clock terminal CK1 is power for this inverter circuit. The capacitive element C2 serves as a coupling capacitance for coupling the clock signal to the node N3.

The buffer circuit is formed of transistors Q9 and Q10 connected in series between the first clock terminal CK1 and first power terminal S1. The transistor Q9 is connected between the first clock terminal CK1 and node N2, and has its gate connected to the node N3. The transistor Q10 is connected between the node N2 and first power terminal S1, and has its gate connected to the node N1. Since the node N1 is the input node and node N3 is the output node of the inverter circuit, the transistors Q9 and Q10 serves as a totem-pole buffer circuit for performing a push-pull operation. As is apparent from the above-described configuration, power for this buffer circuit is also the clock signal input to the first clock terminal CK1.

Further, the pull-down driving circuit according to the present embodiment includes a transistor Q11 connected between the node N2 and first power terminal S1 and having its gate connected to a second clock terminal CK2. The transistor Q11 is controlled by a clock signal input to the second clock terminal CK2, and supplies the node N2 with the low supply voltage VSS to thereby discharge the node N2. The second clock terminal CK2 receives a clock signal of opposite phase to that input to the first clock terminal CK1 (whose active periods do not coincide with each other). When unit shift registers SR are driven by two phase clock signals CLK and /CLK as shown in FIG. 5, for example, a unit shift register SR receiving the clock signal CLK at the first clock terminal CK1 receives the clock signal /CLK at the second clock terminal CK2. In contrast, a unit shift register SR receiving the clock signal /CLK at the first clock terminal CK1 receives the clock signal CLK at the second clock terminal CK2.

The operation of the unit shift register SR according to the present embodiment shown in FIG. 7 will now be described. The unit shift register SR shown in FIG. 7 is also applicable to either of the gate-line driving circuits 30 shown in FIGS. 2 and 5, the configuration shown in FIG. 5 is employed herein.

Figure 8:
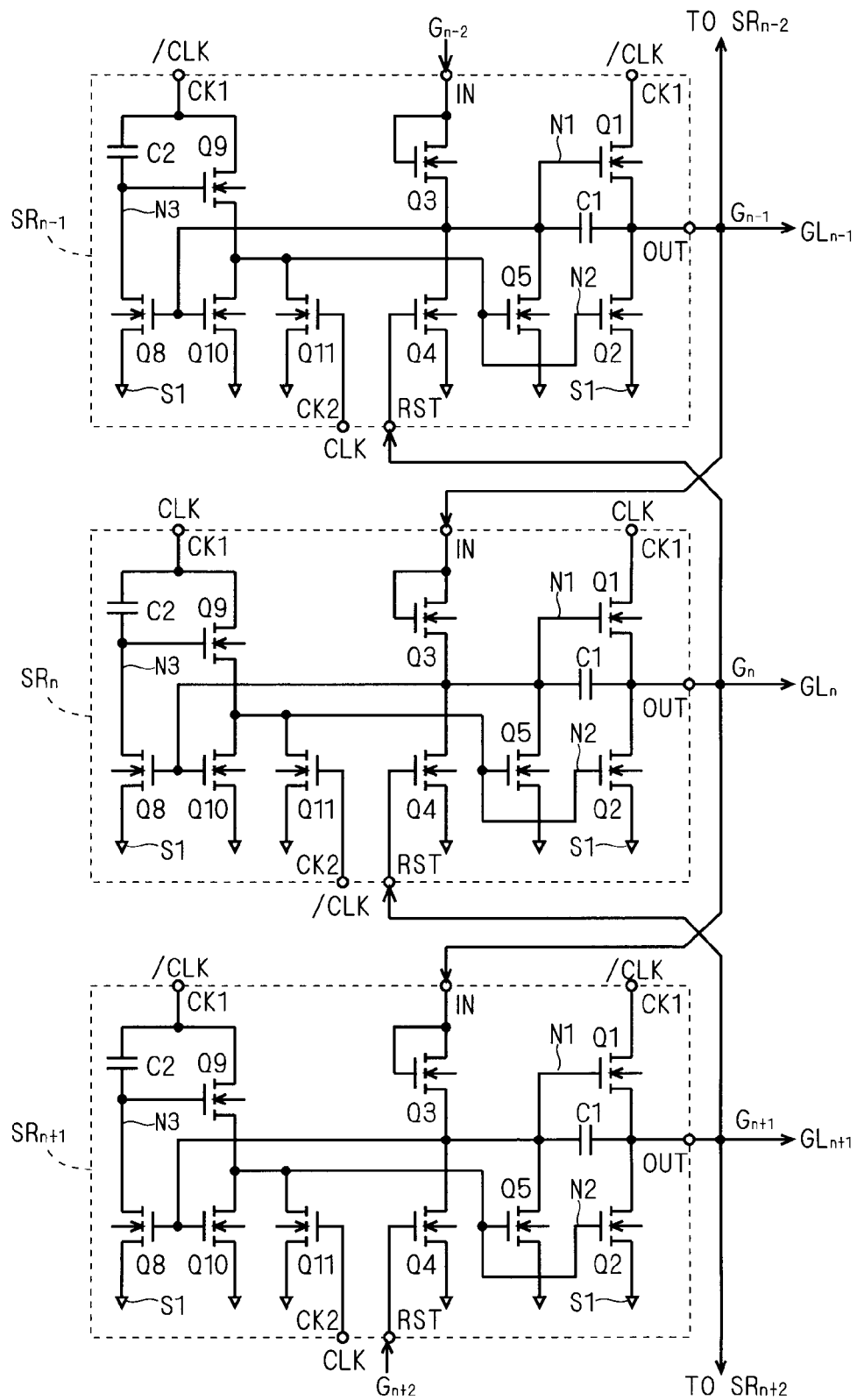
FIG. 8 is a circuit diagram showing the connection between the unit shift registers according to the first preferred embodiment connected in cascade.

The operation of a unit shift register $SR_n$ of the n-th stage will also be described herein as a representative example. FIG. 8 is a circuit diagram showing the connection between the unit shift register $SR_n$ of the n-th stage, the unit shift register $SR_{n-1}$ of the preceding (n−1)th stage and the unit shift register $SR_{n+1}$ of the succeeding (n+1)th stage. FIG. 9 is a timing chart of the operation of the unit shift register $SR_n$, showing the mechanism in which the unit shift register $SR_n$ of the n-th stage keeps the output signal $G_n$ at the H level in the selected state of the gate line $GL_n$ and at the L level in the non-selected state. The operation of the unit shift register SR according to the present embodiment shown in FIG. 7 will now be described.

For simplification, description will be made assuming that the clock signal CLK is input to the first clock terminal CK1 of the unit shift register $SR_n$ and the clock signal /CLK is input to the first clock terminal CK1 of the unit shift registers $SR_{n-1}$ and $SR_{n+1}$. An output signal G from a shift register $SR_i$ of the i-th stage will be indicated by a reference character $G_i$. The potential of the clock signals CLK and /CLK at the H level is assumed to be equal. The potential at the H level is assumed to be the high supply voltage VDD, and the potential at the L level is assumed to be the low supply voltage VSS. Threshold voltages of transistors constituting the unit shift register SR are all assumed to have the same value, Vth.

In the initial state, the unit shift register $SR_n$ is assumed to be in the reset mode in which the node N1 is at the L level (VSS). It is also assumed that the first clock terminal CK1 (clock signal CLK), second clock terminal CK2 (clock signal /CLK), reset terminal RST (output signal $G_{n+1}$ from the immediately succeeding stage), input terminal IN (output signal $G_{n-1}$ from the immediately preceding stage) of the unit shift register $SR_n$ and output terminal OUT (output signal $G_n$) are all at the L level.

Referring to FIG. 9, when the clock signal /CLK rises at time $t_1$, the output signal $G_{n-1}$ from the unit shift register $SR_{n-1}$ of the immediately preceding stage also rises to the H level. Then, the transistor Q11 turns on, to pull down the node N2 having been at the H level until just before time $t_1$ (almost VDD−Vth) to drop to the L level (VSS). The transistors Q2 and Q5 accordingly turn off. The rise in the output signal $G_{n-1}$ from the immediately preceding stage to the H level causes the node N1 to be charged through the transistor Q3 to reach the H level (VDD−Vth). The transistors Q1, Q8 and Q10 accordingly turn on. The nodes N2 and N3 thereby drop to the L level with low impedance.

Next, when the clock signal /CLK falls at time $t_2$, the output signal $G_{n-1}$ from the immediately preceding stage also drops to the L level. Then, the transistor Q3 turns off, causing the node N1 to be kept at VDD–Vth in the floating state. The clock signal /CLK also drops to the L level, to turn off the transistor Q11, however, the node N2 is kept at the L level because the transistor Q10 is kept on.

When the clock signal CLK rises at time $t_3$, the output terminal OUT (output signal $G_n$) starts to rise in level because the transistor Q1 is on and the transistor Q2 is off. At this time, the node N1 rises in level by means of the coupling through the gate-to-channel capacitance of the transistor Q1 and capacitive element C1. Accordingly, the transistor Q1 operates in the non-saturated region, raising the output signal $G_n$ to the H level (VDD) without causing loss by the threshold voltage Vth of the transistor Q1. As a result, the node N1 rises in level to reach as high as about 2×VDD–Vth.

In the pull-down driving circuit of the unit shift register $SR_n$, the clock signal CLK rises to the H level at time $t_3$, causing power to be supplied to the inverter circuit formed of the capacitive element C2 and transistor Q8 and the buffer circuit formed of the transistors Q9 and Q10. At this time, the transistor Q8 is on because the node N1 serving as the input node of the inverter circuit is at the H level, and the node N3 serving as the output node is kept at the L level. Therefore, in the buffer circuit, the transistor Q9 is off and the transistor Q10 is on, so that the node N2 serving as the output node of the buffer circuit is also kept at the L level. Accordingly, the transistors Q2 and Q5 are kept off.

More specifically, when the clock signal CLK rises, the node N3 is going to rise in level by means of the coupling through the capacitive element C2. Since the parasitic capacitance at the node N3 is small, its level may rise to come close to VDD, however, the rise is extremely instantaneous as shown in FIG. 9 because the transistor Q8 is on. Further because the transistor Q10 is on, the node N2 rises in level only slightly even if the transistor Q9 turns on for an instant, and the node N2 is kept at the L level. Accordingly, the transistors Q2 and Q5 are kept off, and charges at the output terminal OUT and node N1 are hardly discharged through the transistors Q2 and Q5, respectively.

The output signal $G_n$ is output to the gate line $GL_n$ and also input to the reset terminal RST of the unit shift register $SR_{n-1}$ of the immediately preceding stage and the input terminal IN of the unit shift register $SR_{n+1}$ of the immediately succeeding stage. Thus, when the output signal $G_n$ rises to the H level, the transistor Q4 turns on, and the node N1 is discharged to drop to the L level in the unit shift register $SR_{n-1}$, causing the transistors Q1, Q8 and Q10 to turn off (that is, the unit shift register $SR_{n-1}$ is brought into the reset mode). In the unit shift register $SR_{n+1}$, the transistor Q3 turns on, and the node N1 is charged to VDD–Vth, causing the transistors Q1, Q8 and Q10 to turn on (that is, the unit shift register $SR_{n+1}$ is brought into the set mode).

When the clock signal CLK falls at time $t_4$, the output signal $G_n$ accordingly falls to reach the L level (VSS) at the same level as the clock signal CLK because the transistor Q1 of the unit shift register $SR_n$ is on. At this time, the node N1 also drops in level by the coupling through the capacitive element C1 and gate-to-channel capacitance of the transistor Q1, so that the node N1 reaches VDD–Vth.

In the pull-down driving circuit, power is not supplied to the inverter circuit and buffer circuit when the clock signal CLK drops to the L level. At this time, however, since the output of the inverter circuit (node N3) and output of the buffer circuit (node N2) are both at the L level, the nodes N2 and N3 are not changed in level even when the CLK drops to the L level.

More specifically, when the clock signal CLK falls, the node N3 is going to drop in level by means of the coupling through the capacitive element C2. However, the level drop at the node N3 is instantaneous as shown in FIG. 9 because the transistor Q8 is on. This level drop at the node N3 occurs at the level lower than VSS, which does not affect the operation of the transistor Q9 which is in the off state. When the output signal $G_n$ falls, the node N2 also drops instantaneously to the negative side mainly by means of the coupling through the gate-to-drain capacitance of the transistors Q2 and Q5. This level drop at the node N2 also occurs at the level lower than VSS, which does not affect the operation of the transistors Q2 and Q5 which are in the off state, and hence, does not affect the operation of the shift register.

When the clock signal /CLK rises and the output signal $G_{n+1}$ from the immediately succeeding stage also rises at time $t_5$, the transistors Q4 and Q11 of the unit shift register $SR_n$ turn on. Then, the node N1 drops to the L level, causing the unit shift register $SR_n$ to return to the reset mode. The node N2 reaches the L level with low impedance.

When the clock signal /CLK falls and the output signal $G_{n+1}$ from the immediately succeeding stage also falls at time $t_6$, the transistors Q4 and Q11 turn off, bringing both the nodes N1 and N2 into the L level with high impedance.

When the clock signal CLK rises at time $t_7$, power is supplied to the inverter circuit and buffer circuit in the pull-down driving circuit. At this time, because the node N1 serving as the input node of the inverter circuit is at the L level, the transistor Q8 is off, and the node N3 serving as the output node of the inverter circuit rises to the H level. Accordingly, in the buffer circuit, the transistor Q9 turns on, and the transistor Q10 turns off, causing the node N2 serving as the output node of the buffer circuit to rise to the H level.

More specifically, when the clock signal CLK rises, the node N3 is going to rise in level by means of the coupling through the capacitive element C2. Since the transistor Q8 is off at this time, the node N3 rises to reach the H level. When setting the capacitance of the capacitive element C2 sufficiently larger than that of the parasitic capacitance at the node N3 (mainly, gate capacitance of the transistor Q9), the node N3 reaches VDD approximately. This level rise at the node N3 turns the transistor Q9 on. Since the transistor Q10 is off at this time, the node N2 rises to the H level (about VDD–Vth). As a result, the transistors Q2 and Q5 of the unit shift register $SR_n$ turn on.

On the other hand, the gate-to-drain overlap capacitance of the transistor Q1 and the on-state resistance of the transistor Q5 constitute a differentiation circuit, and the node N1 thus rises in level following the rising of the clock signal CLK. The level at the node N1 at this time presents a spike waveform which rises instantaneously to a certain level determined by dividing the H level (VDD) of the clock signal CLK by: the capacitive component (gate-to-drain overlap capacitance of the transistor Q1) which is going to couple the clock signal CLK to the node N1 so as to raise the node N1 in level; the parasitic capacitance at the node N1 (gate-to-source capacitance of the transistor Q1, gate capacitances of the transistors Q8 and Q10, etc.); and the capacitive element C1, and then falls at a certain time constant. The on-state resistance of the transistor Q5 is set sufficiently small, and the spike voltage prevents the transistor Q1 from turning on, so that the output terminal OUT is kept at the L level.

When the clock signal CLK falls at time $t_8$, power is not supplied to the inverter circuit and buffer circuit in the pull-down driving circuit. In the inverter circuit, when the power supply (clock signal CLK) drops in level, a coupling with sign reversed from time $t_7$ occurs through the capacitive element C2, causing the node N3 serving as its output node to drop to the L level. In the buffer circuit, the transistor Q9 turns off, but the node N2 serving as its output node is kept in the floating state at the H level because the transistor Q10 is also off. Therefore, the transistors Q2 and Q5 are kept on.

Further, a negative spike voltage occurs at the node N1 oppositely to the spike voltage at time $t_7$, but the negative level occurring at the node N1 is quickly discharged through the transistor Q5 because the transistor Q5 is on, causing the node N1 to return to VSS.

When the clock signal /CLK rises at time $t_9$, the transistor Q11 turns on, and the node N2 is discharged to drop to the L level (VSS). The transistors Q2 and Q5 accordingly turn off. The output terminal OUT is thereby brought into the high impedance state, but the output signal $G_n$ is stably kept at the L level because the capacitance (gate line capacitance) of the gate line GL connected to the output terminal OUT is large.

Thereafter, the operations from time $t_6$ to $t_9$ are repeated until the output signal $G_{n-1}$ of the unit shift register $SR_{n-1}$ of the immediately preceding stage rises to the H level in the next frame period. Therefore, in the unit shift register $SR_n$, the level at the gates of the transistors Q2 and Q5 (node N2) is swung during the non-selected period of the gate line $GL_n$ to rise to the H level (VDD) in synchronization with the rising of the clock signal CLK and drop to the L level (VSS) in synchronization with the rising of the clock signal /CLK.

That is, the gate of the transistor Q2 discharging the output terminal OUT and the gate of the transistor Q5 discharging the node N1 are both prevented from being continuously biased, and the shift in their threshold voltage (Vth shift) is minimized, which suppresses degradation in driving capability. Accordingly, the transistor Q5 is capable of quickly discharging charges at the node N1 caused by noise or the like in the reset mode, and the resistance of the transistor Q1 is kept high. Further, the transistor Q2 is prevented from degrading in driving capability, which minimizes the resistance at the output terminal OUT (output resistance) in the non-selected state, so that the voltage of the gate line in the non-selected state is stabilized more, and the display device is improved in display quality.

The control signals (start pulse SP, clock signals CLK, /CLK) used in the above-described operations are signals that can be output from a general-purpose driving control device, which are not unusual ones. That is, a special driving control device is not required in the present embodiment in order to operate the unit shift register SR.

The pull-down driving circuit of the unit shift register SR according to the present embodiment includes the inverter circuit with a capacitive load and buffer circuit operating upon receipt of the output of the inverter circuit. The buffer circuit is of push-pull type totem-pole shape formed of the transistors Q9 and Q10, and therefore has a high driving capability with a relatively small circuit area. The buffer circuit is thus capable of supplying a voltage of large amplitude to the gates of the transistors Q2 and Q5 (node N2), which achieves reduction in output resistance and pull-down resistance at the node N1 in the shift register while suppressing an increase in circuit area.

In the above description, there is a certain interval between the period during which the clock signal CLK is at the H level and the period during which the clock signal /CLK is at the H level, however, this interval may be omitted. That is, two-phase clocks will do in which the clock signal /CLK rises at the same time when the clock signal CLK rises, and the clock signal /CLK falls at the same time when the clock signal CLK falls.

Second Preferred Embodiment

FIG. 10 is a circuit diagram illustrating the configuration of a unit shift register SR according to a second preferred embodiment of the present invention. In this drawing, elements having similar functions as those shown in FIG. 7 are indicated by the same reference characters. This unit shift register SR is similar to the circuit shown in FIG. 7 except that the transistor Q10 has its gate connected to the output terminal OUT, rather than the node N1.

The operation of a unit shift register $SR_n$ according to the present embodiment is almost similar to that described in the first preferred embodiment. In the first preferred embodiment, the transistor Q10 turns on in the period during which the node N1 is at the H level (from time $t_1$ to time $t_5$ in FIG. 9) to bring the node N2 into the L level, however, in the present embodiment, the transistor Q10 turns on in the period during which the output signal $G_n$ is at the H level (from time $t_3$ to time $t_4$). That is, the transistor Q10 according to the present embodiment operates to prevent the node N2 from rising in level by means of the gate-to-drain overlap capacitance of the transistor Q2 when the output signal $G_n$ rises, thus preventing the transistor Q2 from turning on. The output signal $G_n$ at the H level is thereby prevented from dropping.

The period during which the transistor Q10 is on is shorter than in the first preferred embodiment. In the case of driving the unit shift register SR by the two-phase clock signals CLK and /CLK as shown in FIG. 8, the transistor Q11 turns on to bring the node N2 into the L level even when the transistor Q10 does not turn on at the same time when the node N1 reaches the H level. Therefore, the operation of the unit shift register SR of the present embodiment is substantially the same as in the first preferred embodiment.

In the unit shift register SR shown in FIG. 10, The gate capacitance of the transistor Q10 does not become the parasitic capacitance at the node N1. Accordingly, the parasitic capacitance at the node N1 can be reduced, and the step-up level at the node N1 at the time when the output signal $G_n$ is output can be raised. As a result, the rising rate of the output signal $G_n$ can be increased.

Third Preferred Embodiment

FIG. 11 is a circuit diagram illustrating the configuration of a unit shift register according to a third preferred embodiment of the present invention. In this drawing, elements having similar functions as those shown in FIG. 7 are indicated by the same reference characters. The gate node of the transistor Q8, i.e., the input node of the inverter circuit is defined as a "node N1A". While the gate of the transistor Q1 (node N1) and node N1A are directly connected in the first preferred embodiment (FIG. 7), a transistor Q12 with its gate connected to the node N1A is diode-connected between the nodes N1 and N1A in the unit shift register SR shown in FIG. 11. Further, a transistor Q13 with its gate connected to the input terminal IN is diode-connected between the node N1A and input terminal IN.

In the unit shift register $SR_n$ according to the present embodiment, the node N1 is charged to the H level (VDD–Vth) through the transistor Q3 when the output signal $G_{n-1}$ from the immediately preceding stage is input, while the node N1A is also charged to the H level (VDD–Vth) through the transistor Q13.

The diode-connected transistor Q12 having its anode positioned on the node N1A side and its cathode positioned on the node N1 side serves as a one-way switching device with its forward direction directed to the node N1 from the node N1A. When the node N1 rises in level by the rising of the output signal $G_n$, the diode formed of the transistor Q12 is in the reverse-bias state, so that current does not flow from the node N1 to the node N1A. That is, charging from the node N1 to the node N1A is blocked. Thus, in the process in which the node N1 rises in level by the rising of the output signal $G_n$, the gate capacitances of the transistors Q8 and Q10 do not become the parasitic capacitance at the node N1. Therefore, the parasitic capacitance at the node N1 when the node N1 rises in level is reduced, allowing the step-up level at the node N1 to be higher than in the first preferred embodiment, so that the step-up level at the node N1 when the output signal $G_n$ is output can be raised. As a result, the rising rate of the output signal $G_n$ can be increased.

The gate of the transistor Q10 may be connected to the output terminal OUT by applying the second preferred embodiment to the present embodiment.

Fourth Preferred Embodiment

Figure 12:
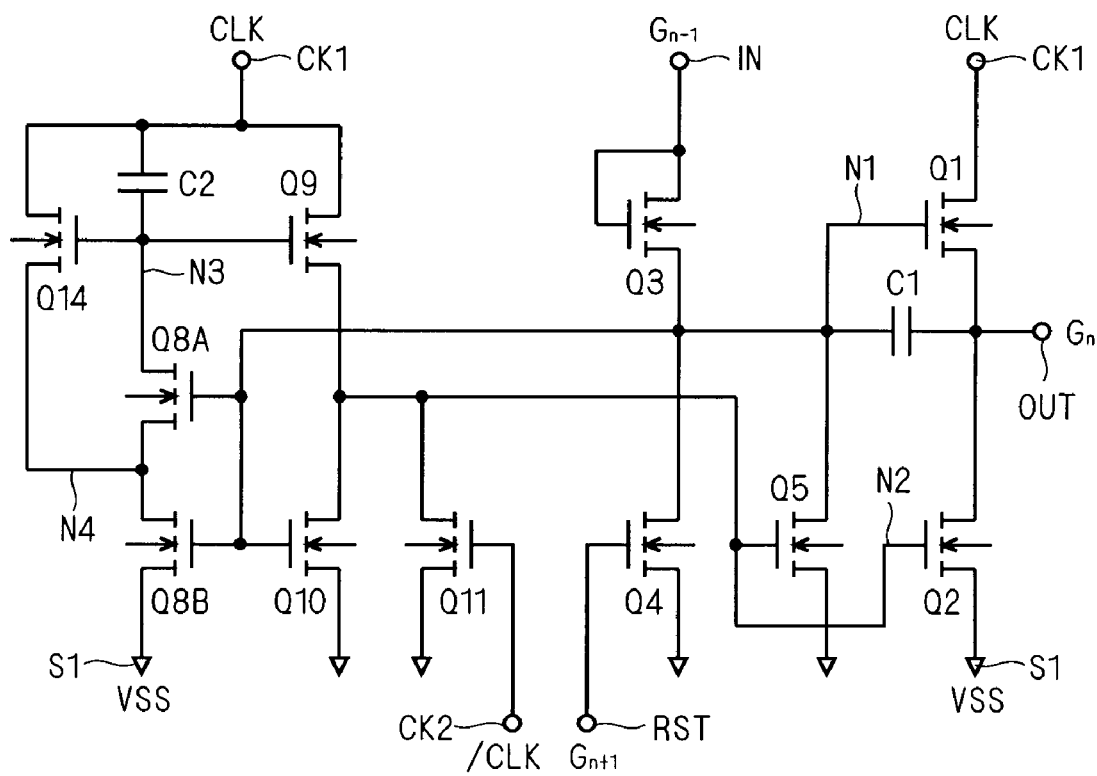
FIG. 12 is a circuit diagram illustrating the configuration of a unit shift register according to a fourth preferred embodiment of the present invention.

FIG. 12 is a circuit diagram illustrating the configuration of a unit shift register according to a fourth preferred embodiment of the present invention. In this drawing, elements having similar functions as those shown in FIG. 7 are indicated by the same reference characters. In the present embodiment, the transistor Q8 in the circuit shown in FIG. 7 is replaced by transistors Q8A and Q8B connected in series between the node N3 and first power terminal S1. The gates of the transistors Q8A and Q8B serve as the input node of the buffer circuit, and both connected to the node N1. Defining a connection node between the transistors Q8A and Q8B as a "node N4", a transistor Q14 with its gate connected to the node N3 is provided between the node N4 and first clock terminal CK1.

That is, in the unit shift register SR according to the present embodiment, the inverter circuit of the pull-down driving circuit is what is called a Schmitt trigger circuit in which the capacitive element C2 serves as a loading element, the transistors Q8A and Q8B serve as driver elements and the transistor Q14 serves as a control element of the threshold voltage of the inverter circuit.

In the unit shift register SR according to the first preferred embodiment, as shown in FIG. 9, a spike voltage occurs at the node N1 in the positive direction when the clock signal CLK rises during a period in which the output signal $G_n$ is kept at the L level (in the non-selected state of the gate line $GL_n$; at time $t_6$ and thereafter). When this spike voltage exceeds the threshold voltage of the transistor Q8, i.e., the threshold voltage of the inverter circuit, the transistor Q8 turns on, and the node N3 drops in level. Then, the transistor Q9 does not turn on sufficiently, which lowers the H level of the node N2, so that the transistor Q5 fails to turn on sufficiently. As a result, the spike voltage further increases in level in a vicious circle, which may finally cause the node N1 to reach such a level that the transistor Q1 turns on.

In contrast, according to the present embodiment, the use of Schmitt trigger type inverter as the inverter circuit increases the threshold voltage of the inverter circuit to prevent the node N2 from dropping in level by the spike voltage. This solves the above-mentioned problems.

In the present embodiment, a Schmitt trigger circuit is used as the inverter circuit, but may also be used as the buffer circuit. FIG. 13 shows such modification. More specifically, the transistor Q10 is replaced by transistors Q10A and Q10B connected in series between the node N2 and first power terminal S1. The transistors Q10A and Q10B have their gates both connected to the node N1. A connection node between the transistors Q10A and Q10B is connected to the node N4. The threshold voltage of the buffer circuit thereby increases, so that the influence by the spike voltage at the node N1 can be minimized.

The gates of the transistors Q10A and Q10B may be connected to the output terminal OUT by applying the second preferred embodiment to the first preferred embodiment. Alternatively, a circuit formed of the transistors Q12 and Q13 shown in FIG. 11 may be connected between the node N1 and input node of the inverter circuit (gates of the transistors Q8A and Q8B) by applying the third preferred embodiment.

Fifth Preferred Embodiment

FIG. 14 is a circuit diagram illustrating the configuration of a unit shift register according to a fifth preferred embodiment of the present invention. In this drawing, elements having similar functions as those shown in FIG. 7 are indicated by the same reference characters. In the present embodiment, a transistor Q15 is further provided between the output terminal OUT and first power terminal S1 in the circuit shown in FIG. 7, and the gate of the transistor Q15 is connected to the second clock terminal CK2. That is, the transistor Q15 is controlled by a clock signal input to the second clock terminal CK2 and discharges (pulls down) the output terminal OUT.

In the circuit shown in FIG. 7, the level at the node N2 during the non-selected period of the unit shift register $SR_n$ is swung to rise to the H level in synchronization with the rising of the clock signal CLK and drop to the L level in synchronization with the rising of the clock signal /CLK, as shown in FIG. 9. In other words, the transistor Q2 is on from the rising of the clock signal CLK to the rising of the clock signal /CLK to keep the output terminal OUT at the L level with low impedance, and in a period other than that period, the transistor Q2 turns off to keep the output terminal OUT at the L level with high impedance (floating state).

In contrast, in the unit shift register $SR_n$ according to the present embodiment, the transistor Q15 is kept on during a period in which the clock signal /CLK input to the second clock terminal CK2 is at the H level, bringing the output terminal OUT into the L level with low impedance. This achieves the effects of reducing the period in which the output terminal OUT is at the L level with high impedance in the non-selected period, thus stabilizing the L level of the output signal $G_n$.

Sixth Preferred Embodiment

Figure 17A:
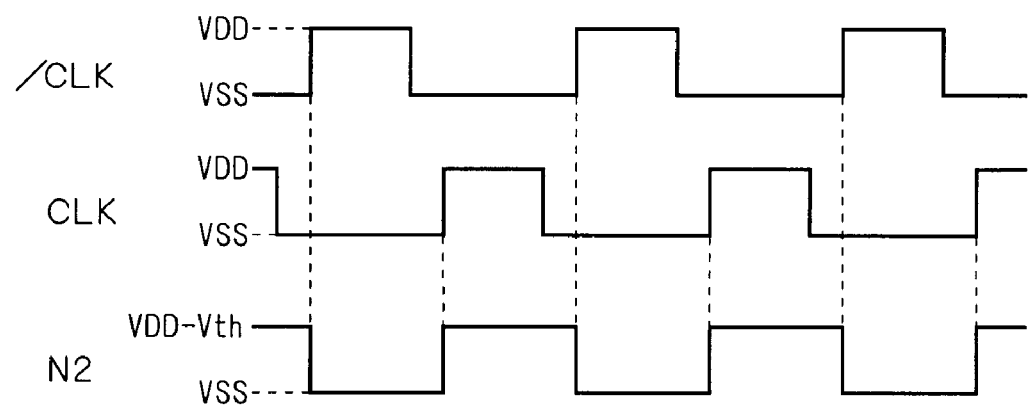
FIGS. 17A and 17B are timing charts of operations of the clock conversion circuits according to the sixth preferred embodiment.

As described, according to the fifth preferred embodiment, the period in which the output terminal OUT is at the L level with high impedance in the non-selected period can be reduced. However, in the case where there is a certain interval between the period in which the clock signal CLK is at the H level (active period) and the period in which the clock signal /CLK is at the H level as in the example shown in FIG. 9, there is a certain period in which the output terminal OUT is at the L level with high impedance in the non-selected period. For instance, in the unit shift register $SR_n$ shown in FIG. 14, there is a period in which the node N2 and clock signal /CLK are both at the L level as shown in FIG. 17A between the rising of the clock signal CLK and the rising of the clock signal /CLK, and the transistors Q2 and Q15 are both off in that period. The output terminal OUT is thus brought into the high impedance state.

FIG. 15 is a circuit diagram illustrating the configuration of a unit shift register according to a sixth preferred embodiment of the present invention. In this drawing, elements having similar functions as those shown in FIGS. 7 and 14 are indicated by the same reference characters. In the present embodiment, the transistor Q15 has its gate connected to an inverter circuit 32 formed of transistors Q16 and Q17 in the circuit shown in FIG. 14.

Defining the gate node of the transistor Q15 as a "node N5", the transistor Q16 is diode-connected between the node N5 and second clock terminal CK2 in the inverter circuit 32. The transistor Q17 is connected between the node N5 and first power terminal S1, and has its gate connected to the first clock terminal CK1. As understood from this configuration, the first clock terminal CK1 serves the input node and the node N5 serves as the output node of the inverter circuit 32, and power is supplied thereto by the clock signal input to the second clock terminal CK2.

Figure 17B:
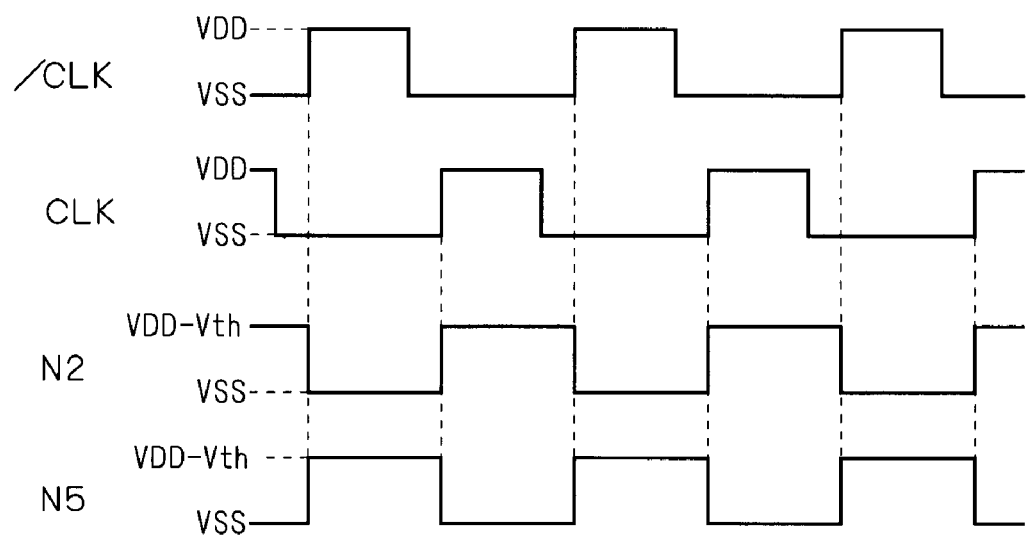

In the inverter circuit 32, the transistor Q16 charges the node N5 in accordance with the clock signal input to the second clock terminal CK2, and the transistor Q17 discharges the node N5 in accordance with the signal input to the first clock terminal CK1. As a result, a signal appears at the node N5 which reaches the H level (VDD–Vth) in synchronization with the rising of the clock signal input to the second clock terminal CK2 and reaches the L level (VSS) in synchronization with the rising of the clock signal input to the first clock terminal CK1, as shown in FIG. 17B. In other words, the node N5 receives a signal having a waveform complementary to the voltage waveform at the node N2 in the non-selected state.

In this manner, the inverter circuit 32 generates a clock signal having a waveform complementary to the voltage waveform at the node N2 in the non-selected state using the clock signals for driving the unit shift register SR. Hereinafter, the inverter circuit 32 will be called a "clock conversion circuit".

The transistor Q15 of the unit shift register SR according to the present embodiment is driven by the clock conversion circuit 32 to turn on in accordance with the rising of the clock signal input to the second clock terminal CK2 and to turn off in accordance with the clock signal input to the first clock terminal CK1. Therefore, in the non-selected state, the transistors Q2 and Q15 do not turn on at the same time, but alternately turn on. As a result, there is no period in which the nodes N2 and N5 are both at the L level, which allows the output terminal OUT to be always kept at the L level with low impedance.

It is not necessary to provide the clock conversion circuit 32 for each of cascade-connected unit shift registers SR, but one clock conversion circuit 32 may be shared by a plurality of unit shift registers SR. For instance, in the case of a shift register driven by the two-phase clock signals CLK and /CLK, a first clock conversion circuit 32A (FIG. 16A) in which the gates of the transistors Q16 and Q17 are supplied with the clock signals /CLK and CLK, respectively, and a second clock conversion circuit 32B (FIG. 16B) in which the gates of the transistors Q16 and Q17 are supplied with the clock signals CLK and /CLK, respectively, may be provided one each. In such case, the clock conversion circuit 32A is shared by a plurality of unit shift registers SR whose first clock terminals CK1 are supplied with the clock signal CLK, and the clock conversion circuit 32B is shared by a plurality of unit shift registers SR whose first clock terminals CK1 are supplied with the clock signal /CLK. This significantly reduces an increase in circuit area as compared to the case of providing the clock conversion circuit 32.

Figure 18A:
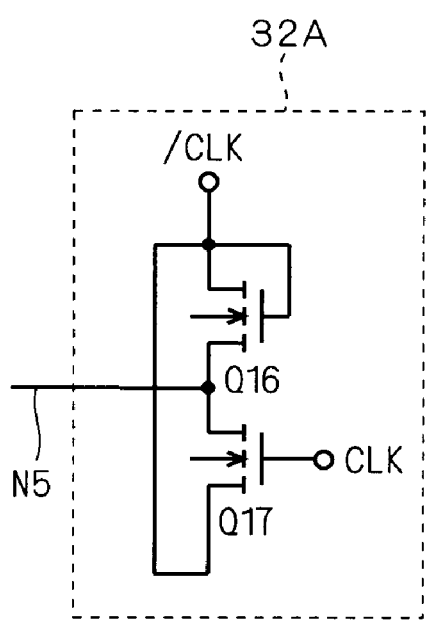
FIGS. 18A and 18B are circuit diagrams respectively illustrating a modification of clock conversion circuits according to the sixth preferred embodiment.
Figure 18B:
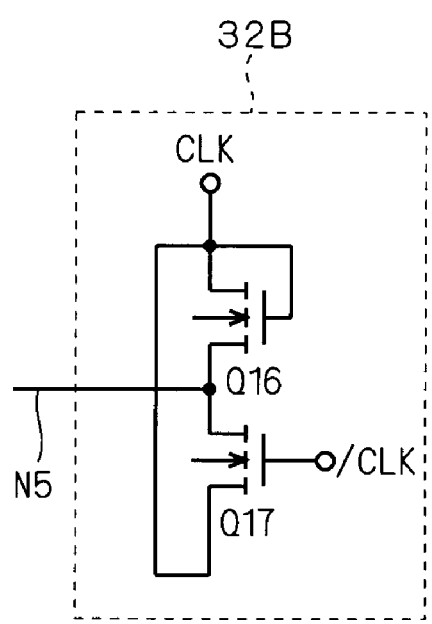

The configurations of the clock conversion circuits 32A and 32B are not limited to those shown in FIGS. 16A and 16B. For instance, as shown in FIGS. 18A and 18B, the source of the transistor Q17 may be connected to the drain of the transistor Q16, and may be supplied with a clock signal of opposite phase to that input to the gate (whose active periods do not coincide with each other). In such case, a state equivalent to that the gate of the transistor Q17 is negatively biased to the source is brought about in the off state of the transistor Q17. The threshold voltage of the transistor Q17 having been shifted in the positive direction thereby returns in the negative direction and is restored. As a result, the Vth shift of the transistor Q17 is minimized, thus suppressing the degradation in driving capability. This allows a small transistor to be used as the transistor Q17, which contributes to reduction in circuit area.

Seventh Preferred Embodiment

In cascade-connected unit shift registers SR, each of which is configured as shown in FIG. 7, the output signal G is input to the gate and drain of the transistor Q3 of the immediately succeeding stage (cf. FIG. 8). In other words, the node N1 of each unit shift register SR is charged using the output signal G from the immediately preceding stage. The node N1 has a relatively large parasitic capacitance because the gate of the transistor Q1 of large size is connected thereto. Thus, the rising rate of the output signal G is likely to be reduced by the time constant based on the parasitic capacitance.

Figure 19:
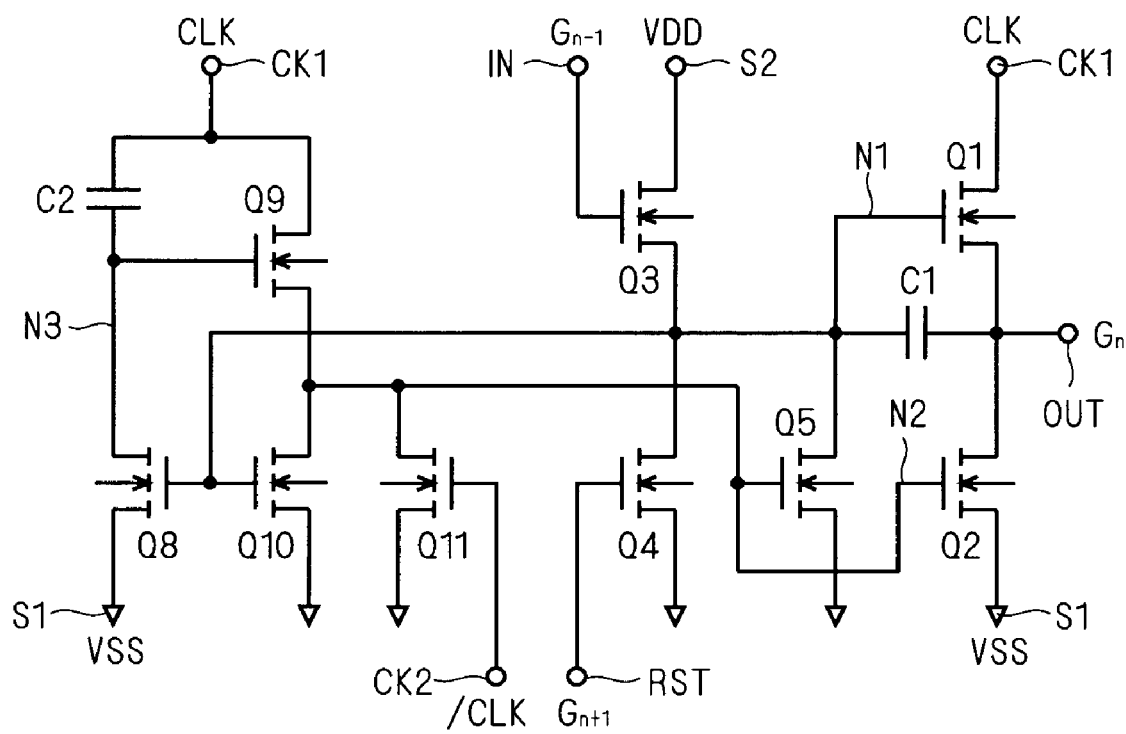
FIG. 19 is a circuit diagram illustrating the configuration of a unit shift register according to a seventh preferred embodiment of the present invention.

FIG. 19 is a circuit diagram illustrating the configuration of a unit shift register according to a seventh preferred embodiment of the present invention. In this drawing, elements having similar functions as those shown in FIG. 7 are indicated by the same reference characters. In the present embodiment, the transistor Q3 in the circuit shown in FIG. 7 has its drain connected to the second power terminal S2 supplied with the high supply voltage VDD.

In the unit shift register SR shown in FIG. 19, the node N1 is charged by the power supply which supplies the high supply voltage VDD, and the output signal G is supplied only to the gate of the transistor Q3. This reduces the load on the output signal G in each unit shift register SR, and increases the rising rate of the output signal G. Further, the charging rate of the node N1 can also be increased, allowing the node N1 to be charged to a sufficiently high level. The rising rate of the output signal G is further increased for this reason as well.

Eighth Preferred Embodiment

In the unit shift register $SR_n$ shown in FIG. 19, there is a period in which the transistor Q5 turns off while the clock signal CLK is at the L level in the non-selected period of the gate line $GL_n$ (in which the node N2 is at the L level). At this time, the node N1 is at the L level with high impedance. When a power supply supplying the potential VDD is connected to the drain of the transistor Q3 as shown in FIG. 19, optical leakage current flows from the second power terminal S2 to the node N1 through the transistor Q3 under the influence of external light incident into the display device or backlit light of a display panel, so that the node N1 rises in level when it is in the high impedance state.

When the node N1 rises in level in such a manner, and the clock signal CLK at the first clock terminal CK1 rises, the node N1 further rises in level by means of the coupling through the gate-to-drain overlap capacitance of the transistor Q1. When the transistor Q1 thereby turns on, a malfunction that the output signal $G_n$ reaches the H level occurs. The present embodiment presents a unit shift register SR capable of solving this problem.

Figure 20:
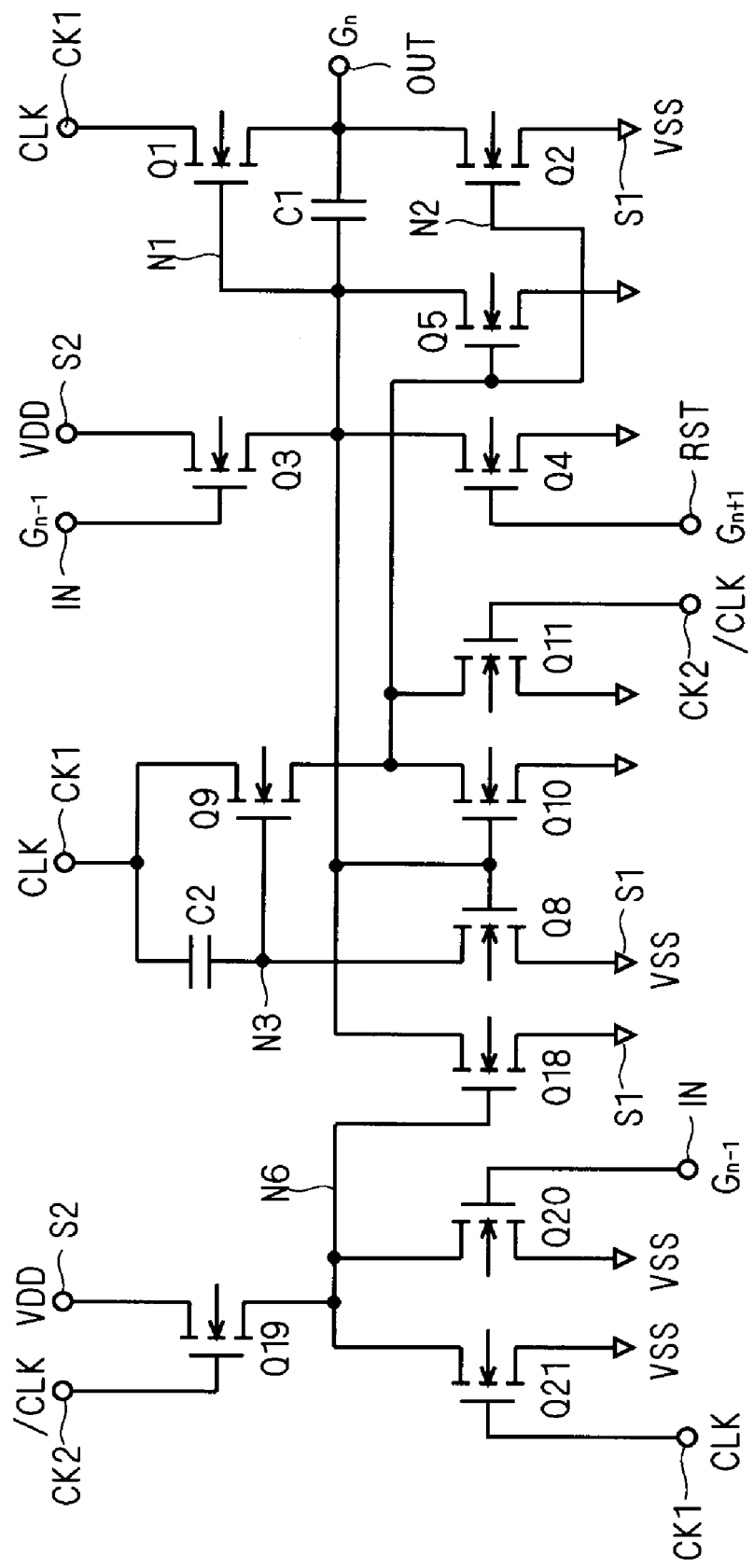
FIG. 20 is a circuit diagram illustrating the configuration of a unit shift register according to an eighth preferred embodiment of the present invention.

FIG. 20 is a circuit diagram illustrating the configuration of the unit shift register SR according to the eighth preferred embodiment of the present invention. In this drawing, elements having similar functions as those shown in FIG. 19 are indicated by the same reference characters. In the present embodiment, a circuit formed of transistors Q18 to Q21 are added to the circuit shown in FIG. 19. The circuit formed of transistors Q18 to Q21 brings the node N1 into the L level with low impedance during a period in which the first clock terminal CK1 is at the H level in the non-selected period of the gate line $GL_n$.

As shown in FIG. 20, the transistor Q18 is connected between the node N1 and first power terminal S1. Defining the gate node of the transistor Q18 as a "node N6", the transistor Q19 is connected between the node N6 and second power terminal S2, and has its gate connected to the second clock terminal CK2. The transistor Q20 is connected between node N6 and first power terminal S1, and has its gate connected to the input terminal IN. The transistor Q21 is also connected between the node N6 and first power terminal S1, and has its gate connected to the first power terminal S1.

The transistor Q20 is set to have an on-state resistance sufficiently smaller than that of the transistor Q19. That is, the transistors Q19 and Q20 constitute a ratio type inverter in which the transistor Q19 serves as the loading element and the transistor Q20 serves as a driver element. Therefore, when the output signal $G_{n-1}$ from the immediately preceding stage rises to the H level in the unit shift register $SR_n$, for example, the clock signal /CLK at the second clock terminal CK2 also rises to the H level, so that the transistors Q19 and Q20 both turn on, however, the node N6 serving as the output node of the inverter circuit drops to the L level.

In the non-selected period of the gate line $GL_n$, the output signal $G_{n-1}$ is at the L level and the transistor Q20 is off. Thus, the level at the node N6 of the unit shift register $SR_n$ is swung to be at the L level between the rising of the clock signal CLK and the rising of the clock signal /CLK and to be at the H level between the rising of the clock signal /CLK and the rising of the clock signal CLK. In other words, the signal waveforms at the nodes N2 and N6 are complementary to each other in the non-selected period of the gate line $GL_n$, so that the transistors Q5 and Q18 alternately turn on to bring the node N1 into the L level with low impedance. This prevents the level rise at the node N1 resulting from optical leakage current. Further, this prevents the gate of the transistor Q18 from being continuously biased, which also achieves the effect of minimizing its Vth shift.

When the output signal $G_{n-1}$ from the immediately preceding stage rises to the H level, the transistor Q20 turns on. Since the transistor Q20 has an on-state resistance sufficiently smaller than that of the transistor Q19 as described above, the node N6 is pulled down to the L level regardless of whether the transistor Q19 is on or off. The transistor Q18 accordingly turns off, and the node N1 is charged through the transistor Q3 to rise to the H level.

Thereafter, when the output signal $G_{n-1}$ from the immediately preceding stage returns to the L level, the clock signal /CLK also drops to the L level at the same time, so that the node N6 is kept at the L level. Further, even during a period in which the output signal $G_n$ is at the H level, the transistor Q21 turns on by the clock signal CLK, so that the node N6 is kept at the L level, and the transistor Q18 is kept off. That is, the transistor Q18 is continuously off in the charging period of the node N1 and selected period of the gate line $GL_n$. Thus, the circuit formed of the transistors Q18 to Q21 does not affect the operation of the unit shift register $SR_n$ of outputting the output signal $G_n$. The unit shift register $SR_n$ according to the present embodiment is therefore capable of performing a similar operation as the circuit shown in FIG. 19.

As described, in the present embodiment, the transistor Q18 is kept off during the period in which the signal input to the input terminal IN is at the H level (active period), and in the period other than the active period, turns on in accordance with the rising of the clock signal input to the second clock terminal CK2 and turns off in accordance with the rising of the clock signal input to the first clock terminal CK1.

Figure 21:
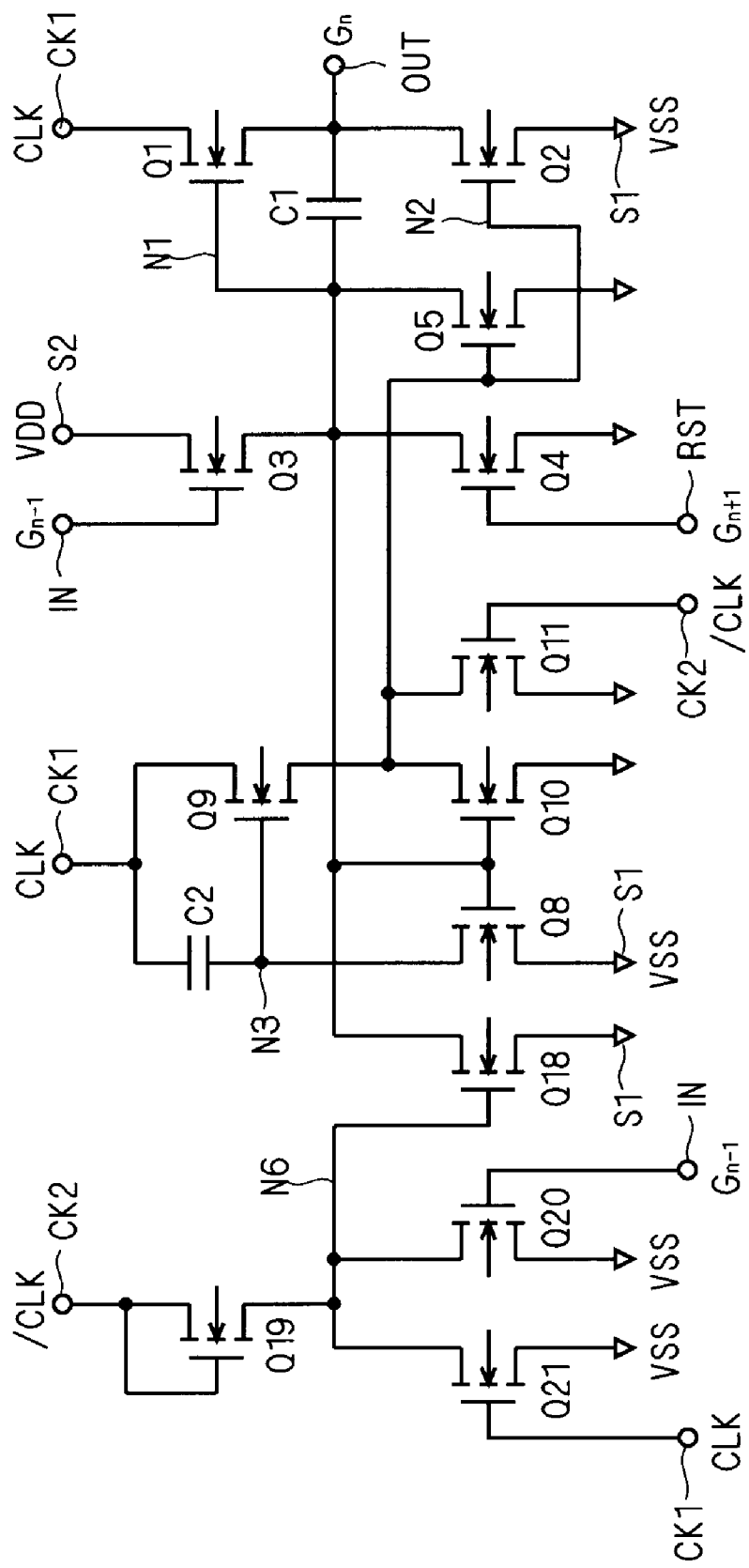
FIG. 21 is a circuit diagram illustrating the configuration of a unit shift register according to a modification of the eighth preferred embodiment.

While the transistor Q19 shown in FIG. 20 has its drain connected to the power supply supplying the potential VDD similarly to the drain of the transistor Q3, they may be connected to different power supplies. Alternatively, as shown in FIG. 21, the drain of the transistor Q19 as well as the gate may be connected to the second clock terminal CK2 (that is, the transistor Q19 may be diode-connected between the node N6 and second clock terminal CK2). In that case, the node N6 is charged by the clock signal input to the second clock terminal CK2, but the same operation as described above is performed, so that similar effects can be obtained.

Ninth Preferred Embodiment

Figure 22:
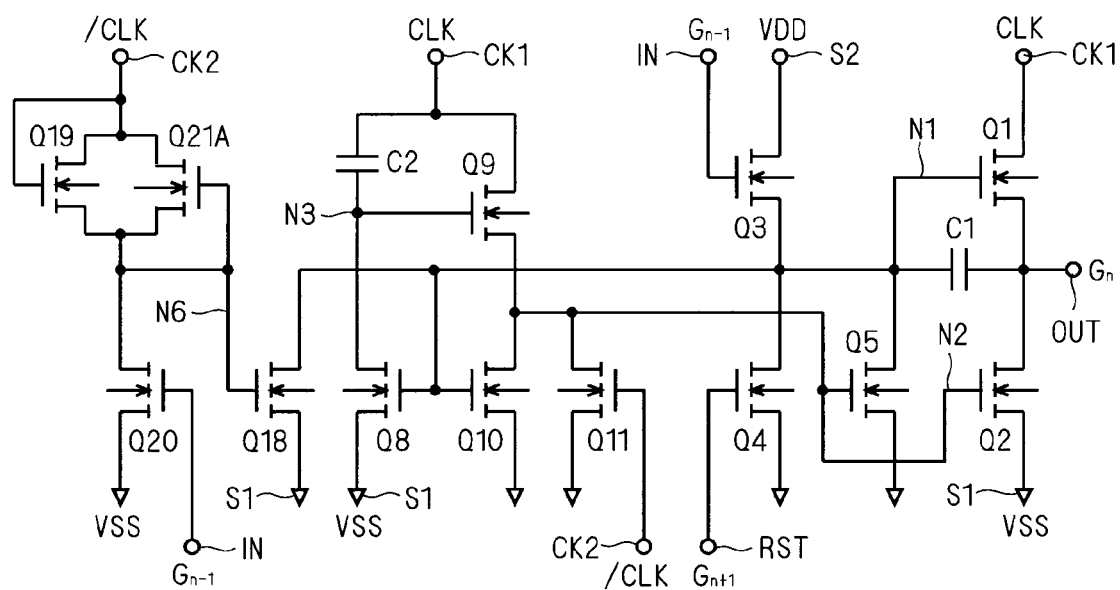
FIG. 22 is a circuit diagram illustrating the configuration of a unit shift register according to a ninth preferred embodiment of the present invention.

FIG. 22 is a circuit diagram illustrating the configuration of a unit shift register according to a ninth preferred embodiment of the present invention. In this drawing, elements having similar functions as those shown in FIG. 20 are indicated by the same reference characters. In the present embodiment, the transistor Q21 in the circuit shown in FIG. 20 is replaced by a transistor Q21A connected between the node N6 and second clock terminal CK2. The transistor Q21A has its gate connected to the node N6 (that is, the transistor Q21A is diode-connected). The transistor Q19 is diode-connected between the node N6 and second clock terminal CK2 as illustrated in FIG. 21 as a modification.

In the unit shift register $SR_n$ according to the present embodiment, the transistor Q19 turns on when the clock signal /CLK is at the H level to charge the node N6 to be brought into the H level, while the transistor Q21A turns on when the clock signal /CLK is at the L level to discharge the node N6 to be brought into the L level (Vth). During the period in which the output signal $G_{n-1}$ from the immediately preceding stage is at the H level (active period), the transistor Q20 turns on to keep the node N6 at the L level. That is, the transistor Q18 according to the present embodiment is kept off in the active period of the signal input to the input terminal IN and turns on/off in the period other than the active period in response to the clock signal input to the second clock terminal CK2 (to turn on in the active period of that clock signal).

Since the first clock terminal CK1 and second clock terminal CK2 receive clock signals of opposite phases to each other, the transistor Q21A, as a result, operates almost similarly to the transistor Q21 shown in FIG. 20. Therefore, similar effects can be obtained.

Tenth Preferred Embodiment

FIG. 23 is a circuit diagram illustrating the configuration of a unit shift register according to a tenth preferred embodiment of the present invention. In this drawing, elements having similar functions as those shown in FIG. 20 are indicated by the same reference characters. In the present embodiment, the transistors Q19 and Q21A in the circuit shown in FIG. 22 are replaced by a capacitive element C3. That is, the capacitive element C3 and transistor Q20 constitute an inverter circuit with a capacitive load.

The capacitive element C3 capacitively couples the second clock terminal CK2 and node N6. Thus, the capacitive element C2 of the unit shift register $SR_n$, for example, raises the node N6 in level at the rising of the clock signal /CLK, and pulls down the node N6 in level at the falling of the clock signal /CLK. As a result, the capacitive element C3 operates similarly to the transistors Q19 and Q21A shown in FIG. 22.

That is, in the present embodiment, the transistor Q18 is kept off in the active period of the signal input to the input terminal IN, and in the period other than the active period, turns on/off in accordance with the clock signal input to the second clock terminal CK2 (to turn on in the active period of that clock signal). Therefore, the unit shift register SR according to the present embodiment operates almost similarly to that of the eighth preferred embodiment, and achieves similar effects.

Eleventh Preferred Embodiment

FIG. 24 is a circuit diagram illustrating the configuration of a unit shift register according to an eleventh preferred embodiment of the present invention. In this drawing, elements having similar functions as those shown in FIG. 20 are indicated by the same reference characters. In the present embodiment, the transistor Q18 in the circuit shown in FIG. 20 has its source connected to the input terminal IN and its gate (node N6) connected to the second clock terminal CK2.

According to the unit shift register $SR_n$ of the present embodiment, the gate of the transistor Q18 (clock signal /CLK) is at the H level during a period in which the output signal $G_{n-1}$ from the immediately preceding stage rises to the H level to cause the node N1 to be charged through the transistor Q3, but the source (output signal $G_{n-1}$ from the immediately preceding stage) is also at the H level. Thus, the transistor Q18 does not turn on, and the node N1 is charged to the H level. During the non-selected period after the output signal $G_{n-1}$ from the immediately preceding stage drops to the L level, the source of the transistor Q18 drops to the L level. Thus, the transistor Q18 turns on every time the clock signal /CLK rises to the H level, to bring the node N1 into the L level with low impedance.

That is, in the present embodiment, the transistor Q18 is kept off in the active period of the signal input to the input terminal IN, and in the period other than the active period, turns on/off in accordance with the clock signal input to the second clock terminal CK2 (to turn on in the active period of that clock signal). Therefore, the unit shift register SR according to the present embodiment operates almost similarly to that of the eighth preferred embodiment, and achieves similar effects. This prevents a level rise caused by optical leakage current in the non-selected state.

In the circuit shown in FIG. 24, there is a period in which the node N1 is in the high impedance state between the falling of the clock signal /CLK and the rising of the clock signal CLK. To prevent the level rise at the node N1 in that period, the output signal from the clock conversion circuit 32 shown in FIG. 16 or 18 may be input to the gate of the transistor Q18 (node N6) (cf. FIG. 25).

Then, the transistor Q18 is kept off in the period during which the signal input to the input terminal IN is at the H level (active period) and, in the period other than the active period, turns on in accordance with the rising of the clock signal input to the second clock terminal CK2 and turns off in accordance with the rising of the clock signal input to the first clock terminal CK1, just the same as in the eighth preferred embodiment. In other words, the transistor Q18 operates complementarily to the transistor Q5 in the non-selected period, which can eliminate a period in which the node N1 is in the high impedance state.

Twelfth Preferred Embodiment

FIG. 26 is a circuit diagram illustrating the configuration of a unit shift register according to a twelfth preferred embodiment of the present invention. In this drawing, elements having similar functions as those shown in FIG. 7 are indicated by the same reference characters. In the present embodiment, the source of the transistor Q11 in the circuit shown in FIG. 7 is connected to the first clock terminal CK1, rather than the first power terminal S1.

In the unit shift register $SR_n$ shown in FIG. 7, the gate of the transistor Q11 is repeatedly positive-biased by the clock signal /CLK, so that the Vth shift is likely to occur. In contrast, in the unit shift register $SR_n$ according to the present embodiment, the gate-to-source bias of the transistor Q11 is changed between positive when the clock signal /CLK is at the H level and negative when the clock signal CLK is at the H level. This minimizes the Vth shift of the transistor Q11, which achieves the effect that the node N2 can be discharged with low impedance.

The present embodiment may be applied to either unit shift register SR in which the transistor Q11 has its source connected to the first power terminal S1 among the above-described preferred embodiments.

Thirteenth Preferred Embodiment

FIG. 27 is a circuit diagram illustrating the configuration of a unit shift register according to a thirteenth preferred embodiment of the present invention. In this drawing, elements having similar functions as those shown in FIG. 7 are indicated by the same reference characters. In the present embodiment, the transistors Q2 and Q5 in the circuit shown in FIG. 7 have their sources connected to the second clock terminal CK2, rather than the first power terminal S1.

In the unit shift register $SR_n$ shown in FIG. 7, the gates of the transistors Q2 and Q5 (node N2) are repeatedly positive-biased in accordance with the rising of the clock signal CLK as shown in FIG. 9, so that their Vth shifts are likely to occur. In contrast, in the unit shift register $SR_n$ according to the present embodiment, the gate-to-source bias of the transistors Q2 and Q5 is changed between positive when the clock signal CLK is at the H level and negative when the clock signal /CLK is at the H level. This minimizes the Vth shifts of the transistors Q2 and Q5, which achieves the effect that the output terminal OUT and node N1 can be discharged with low impedance.

In the present embodiment, the transistors Q2 and Q5 have their sources both connected to the second clock terminal CK2, by way of example, however, only one of the sources may be connected to the second clock terminal CK2. Further, the present embodiment may be applied to either unit shift register SR in which the transistors Q2 and Q5 have their sources connected to the first power terminal S1 among the above-described preferred embodiments.

Fourteenth Preferred Embodiment

Figure 28:
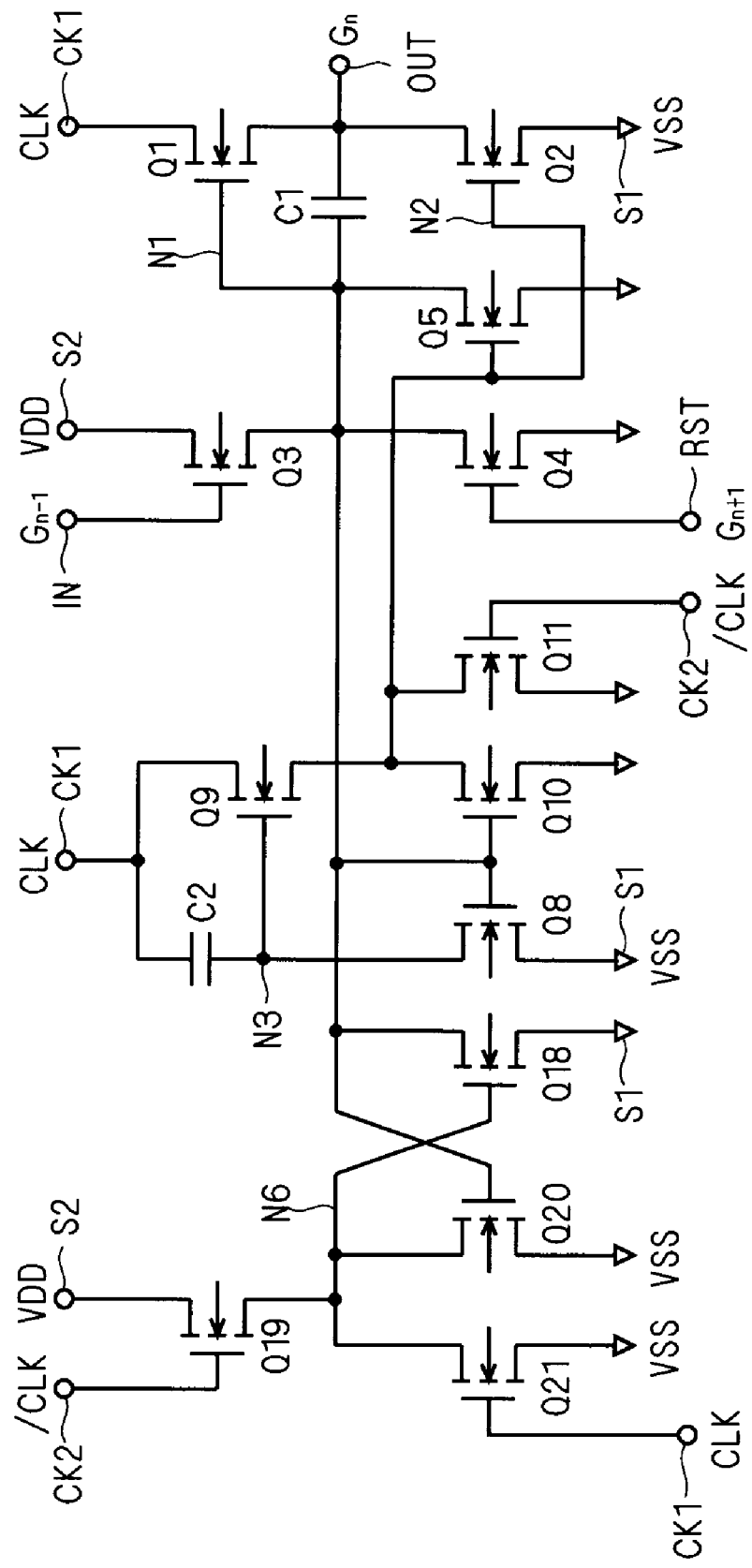
FIG. 28 is a circuit diagram illustrating the configuration of a unit shift register according to a fourteenth preferred embodiment of the present invention.

FIG. 28 is a circuit diagram illustrating the configuration of a unit shift register according to a fourteenth preferred embodiment of the present invention. In this drawing, elements having similar functions as those shown in FIG. 20 are indicated by the same reference characters. In the present embodiment, the transistor Q20 in the circuit shown in FIG. 20 has its gate connected to the node N1, rather than the input terminal IN.

In the unit shift register $SR_n$ according to the present embodiment, when the output signal $G_{n-1}$ from the immediately preceding stage rises to the H level, the node N1 is charged through the transistor Q3 to rise in level, to thereby turn on the transistor Q20. Thereafter, the node N6 reaches the L level similarly to the case shown in FIG. 20, and the transistor Q18 turns off, so that the node N1 rises to the H level. That is, the transistor Q20 is controlled by the voltage at its node N1, rather than being directly controlled by the unit shift register $SR_{n-1}$.

Therefore, the layout of wiring of the output signal G is simpler than in the circuit shown in FIG. 20, which contributes to reduction in circuit area. The present embodiment may be applied to either unit shift register SR having its input terminal IN connected to the gate of the transistor Q20 among the above-described preferred embodiments.

Fifteenth Preferred Embodiment

Figure 29:
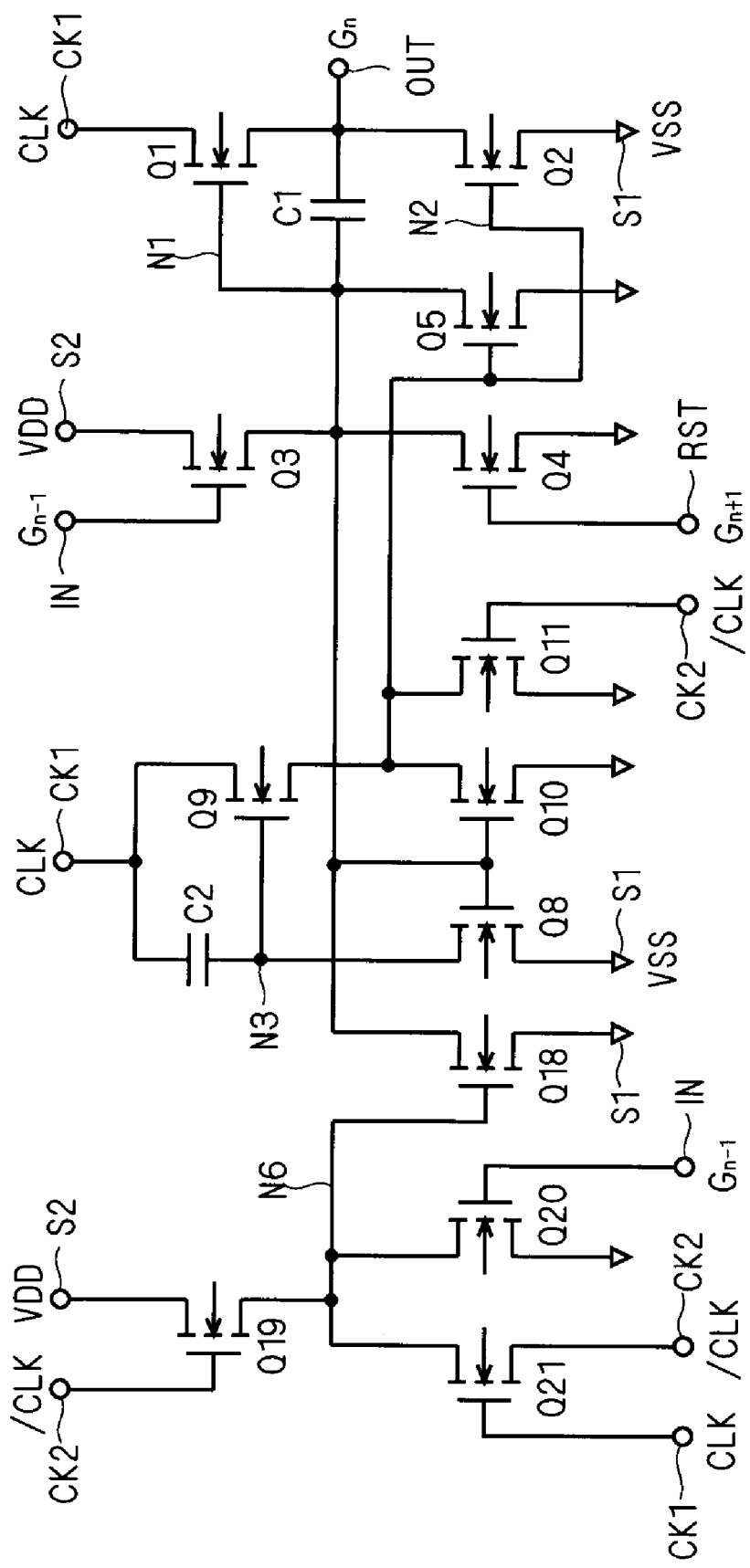
FIG. 29 is a circuit diagram illustrating the configuration of a unit shift register according to a fifteenth preferred embodiment of the present invention.

FIG. 29 is a circuit diagram illustrating the configuration of a unit shift register according to a fifteenth preferred embodiment of the present invention. In this drawing, elements having similar functions as those shown in FIG. 20 are indicated by the same reference characters. In the present embodiment, the transistor Q21 in the circuit shown in FIG. 20 has its source connected to the second clock terminal CK2, rather than the first power terminal S1.

In the unit shift register $SR_n$ shown in FIG. 20, the gate of the transistor Q21 is repeatedly positive-biased in accordance with the rising of the clock signal CLK, so that the Vth shift is likely to occur. In contrast, in the unit shift register $SR_n$ according to the present embodiment, the gate-to-source bias of the transistor Q21 is changed between positive when the clock signal CLK is at the H level and negative when the clock signal /CLK is at the H level. This minimizes the Vth shift of the transistor Q21, which achieves the effect that the node N6 can be discharged with low impedance.

The present embodiment may be applied to either unit shift register SR in which the transistor Q21 has its source connected to the first power terminal S1 among the above-described preferred embodiments.

Sixteenth Preferred Embodiment

Figure 30:
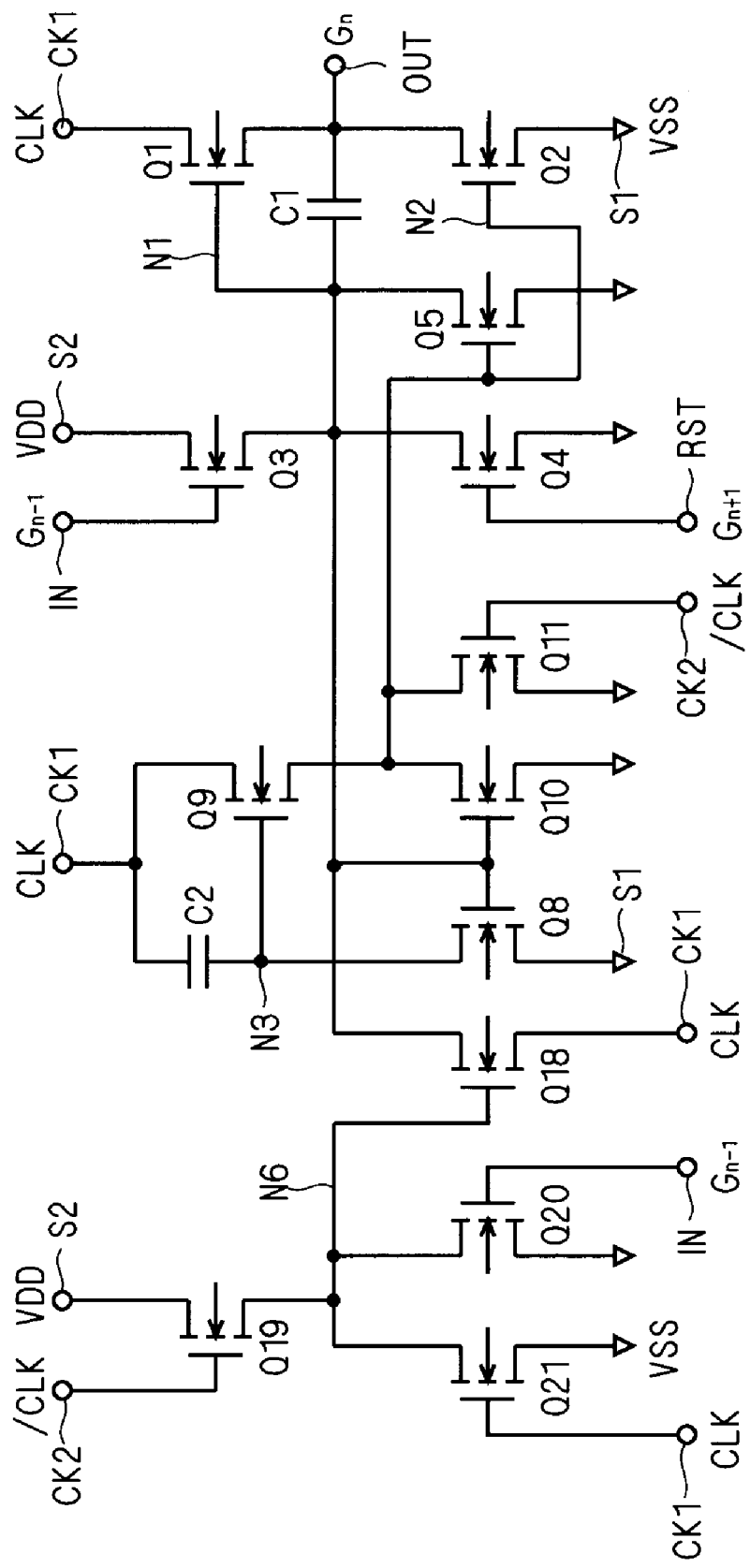
FIG. 30 is a circuit diagram illustrating the configuration of a unit shift register according to a sixteenth preferred embodiment of the present invention.

FIG. 30 is a circuit diagram illustrating the configuration of a unit shift register according to a sixteenth preferred embodiment of the present invention. In this drawing, elements having similar functions as those shown in FIG. 20 are indicated by the same reference characters. In the present embodiment, the transistor Q18 in the circuit shown in FIG. 20 has its source connected to the first clock terminal CK1, rather than the first power terminal S1.

In the unit shift register $SR_n$ shown in FIG. 20, the gate of the transistor Q18 is repeatedly positive-biased in accordance with the rising of the clock signal /CLK, so that the Vth shift is likely to occur. In contrast, in the unit shift register $SR_n$ according to the present embodiment, the gate-to-source bias of the transistor Q18 is changed between positive when the clock signal /CLK is at the H level and negative when the clock signal CLK is at the H level. This minimizes the Vth shift of the transistor Q18, which achieves the effect that the node N1 can be discharged with low impedance.

The present embodiment may be applied to either unit shift register SR in which the transistor Q18 has its source connected to the first power terminal S1 among the above-described preferred embodiments.

Seventeenth Preferred Embodiment

For instance, in the circuit shown in FIG. 7, a large voltage is applied between the drain (node N1) and source (first power terminal S1) of the transistor Q5 when the node N1 rises in level in accordance with the rising of the output signal G, which may cause leakage current to flow between the drain and source depending on the breakdown voltage characteristics of the transistor Q5, causing the stepped-up node N1 to drop. As countermeasures, a transistor Q5A connected to the node N2 is interposed between the source of the transistor Q5 and first power terminal S1 as shown in FIG. 31 (that is, the transistors Q5 and Q5A are connected in series between the node N1 and first power terminal S1), to divide the voltage at the node N1 by the transistors Q5 and Q5A).

Figure 31:
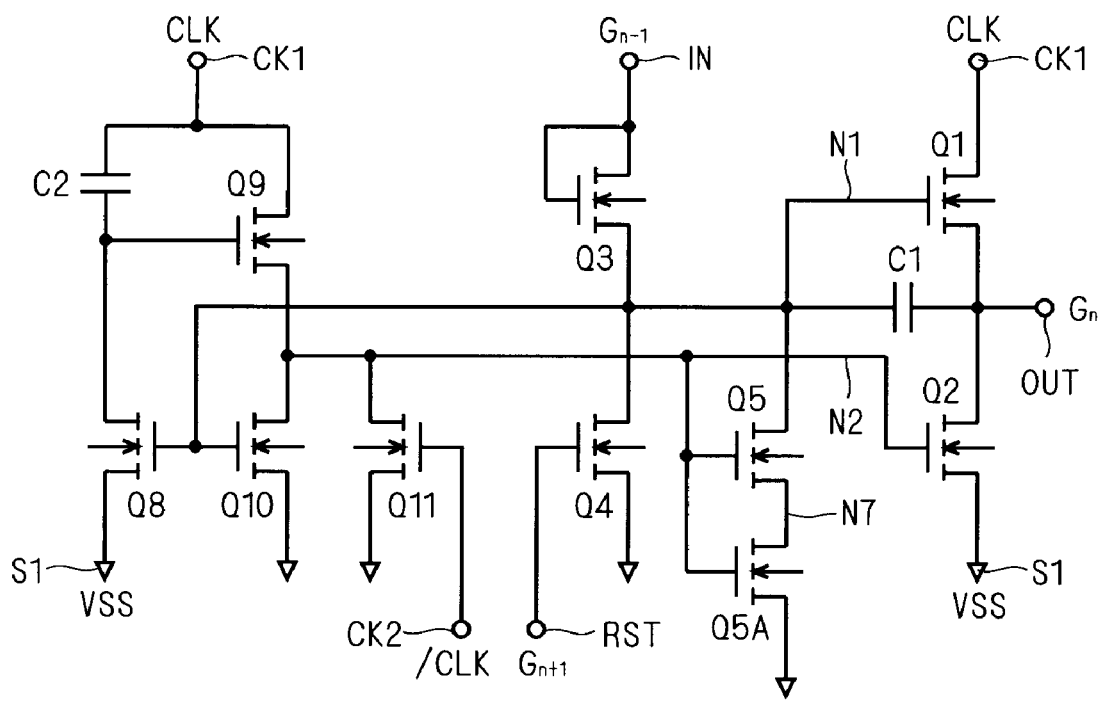
FIG. 31 is a circuit diagram for explaining the problems to be solved by a unit shift register according to a seventeenth preferred embodiment of the present invention.

However, the Vth shifts of the transistors Q5 and Q5A cannot be minimized even by connecting the source of the transistor Q5A to the second clock terminal CK2 applying the thirteenth preferred embodiment to the circuit shown in FIG. 31. This is because a positive potential cannot be applied to the source of the transistor Q5 (defined as a "node N7") because of the concurrent turning-off of the transistors Q5 and Q5A in the circuit shown in FIG. 31 in the non-selected period of the unit shift register SR, so that the gate of the transistor Q5 cannot be negative-biased to the source. The present embodiment shows the countermeasures.

Figure 32:
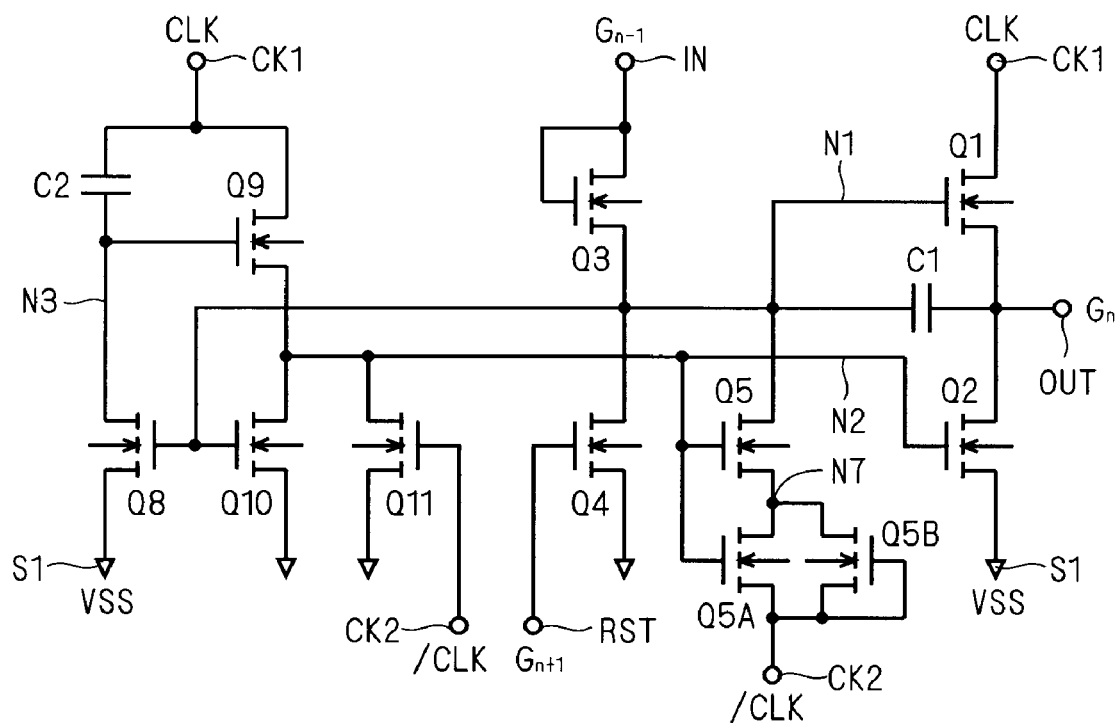
FIG. 32 is a circuit diagram illustrating the configuration of a unit shift register according to the seventeenth preferred embodiment.

FIG. 32 is a circuit diagram illustrating the configuration of a unit shift register according to the seventeenth preferred embodiment. In this drawing, elements having similar functions as those shown in FIGS. 7 and 31 are indicated by the same reference characters. In the present embodiment, the transistor Q5A has its source connected to the second clock terminal CK2 by applying the thirteenth preferred embodiment to the circuit shown in FIG. 31. Further, a transistor Q5B is connected between the connection node (node N7) between the transistors Q5 and Q5A and the second clock terminal CK2 (source of the transistor Q5A), and has its gate connected to the second clock terminal CK2 (that is, the transistor Q5B is diode-connected).

According to the present embodiment, the transistors Q5 and Q5A both turn on when the clock signal CLK is at the H level in the non-selected period of the unit shift register $SR_n$, bringing the node N7 into the L level, so that the gate and source of each of the transistors Q5 and Q5A are positive-biased. When the clock signal /CLK is at the H level, the transistors Q5 and Q5A both turn off, but the node N7 rises to the H level (VDD−Vth) by the transistor Q5B, so that the gate and source of each of the transistors Q5 and Q5A are positive-biased. This achieves the effects of the thirteenth preferred embodiment that the Vth shifts of the transistors Q5 and Q5A are minimized and the node N1 can be discharged with low impedance.

The transistor Q5B conducts when the clock signal /CLK is at the H level, to bias the node N7 to the H level, but non-conducts when the clock signal /CLK is at the L level, thus not affecting the potential at the node N7. Therefore, the transistor Q5B does not affect the operations of the transistors Q5 and Q5A of discharging the node N1 and dividing and latching the voltage at the stepped-up node N1.

The present embodiment may be applied to either unit shift register SR in which the transistor Q5 has its source connected to the first power terminal S1 among the above-described preferred embodiments.

Eighteenth Preferred Embodiment

Figure 33:
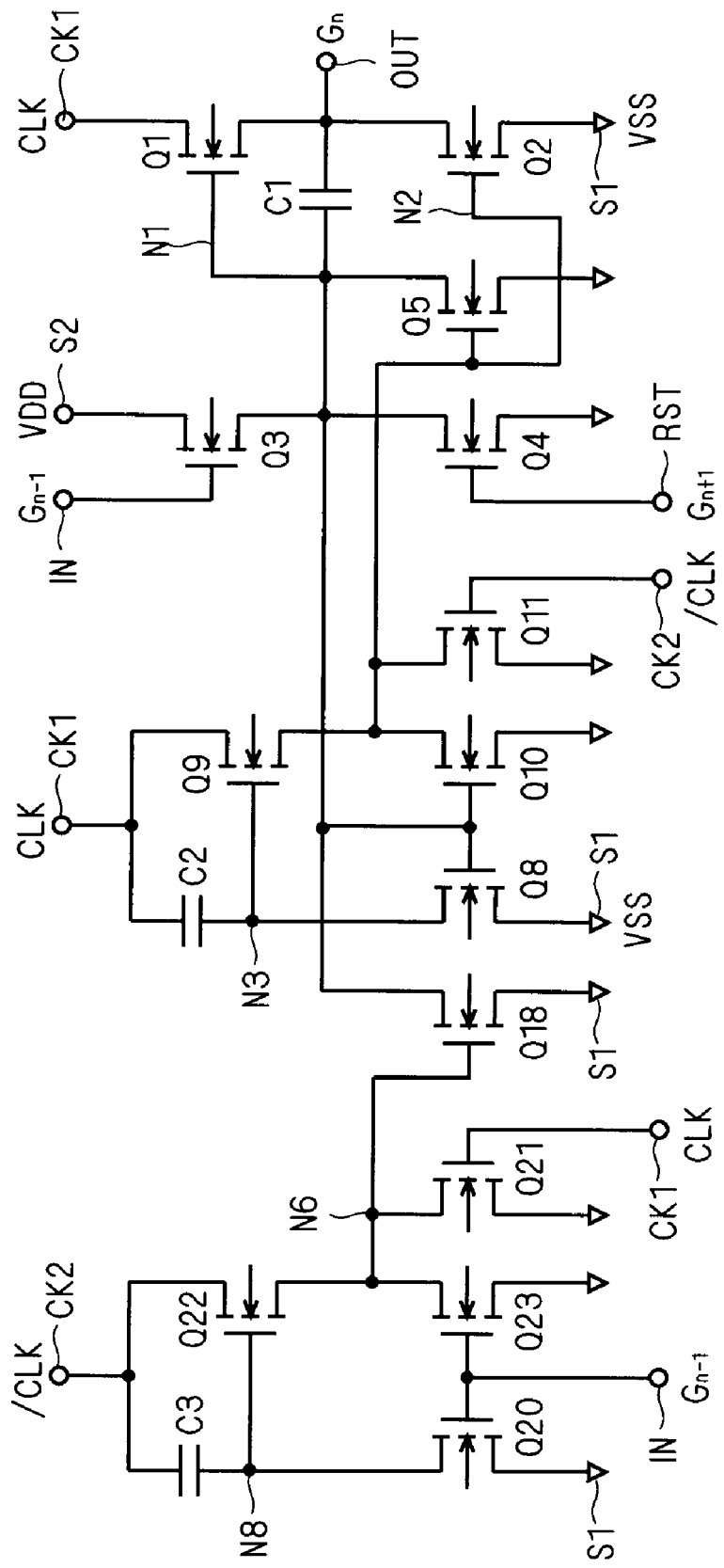
FIG. 33 is a circuit diagram illustrating the configuration of a unit shift register according to an eighteenth preferred embodiment of the present invention.

FIG. 33 is a circuit diagram illustrating the configuration of a unit shift register according to an eighteenth preferred embodiment of the present invention. In this drawing, elements having similar functions as those shown in FIGS. 20 and 23 are indicated by the same reference characters. In the present embodiment, the output of an inverter circuit formed of the capacitive element C3 and a transistor Q20 is not directly supplied to the node N6, but a buffer circuit formed of transistors Q22 and Q23 are interposed therebetween in the circuit shown in FIG. 23.

The circuit formed of the capacitive element C3 and transistor Q20 is an inverter circuit with capacitive load in which the input terminal IN serves as its input node, and the circuit formed of transistors Q22 and Q23 is a buffer circuit receiving the output from the inverter circuit (potential at a connection node (node N8) between the capacitive element C3 and transistor Q20). The buffer circuit is a totem-pole buffer circuit for performing a push-pull operation. This is a ratioless type circuit, and has a great driving capability with low power consumption. Therefore, the present embodiment is effective when the node N1 needs to be discharged at high speeds to be brought into the reset mode.

As is understood from FIG. 33, the circuit formed of the transistors Q8 to Q1 and capacitive element C2 and the circuit formed of the transistors Q20 to Q23 and capacitive element C3 have the same configuration, except that the connection to the first and second clock terminals CK1 and CK2 is opposite to each other. Therefore, during the non-selected period, a signal complementary to that at the node N2 occurs at the node N6. During the period in which the signal input to the input terminal IN is at the H level (active period), the transistor Q21 turns on, to bring the node N6 into the L level.

That is, in the present embodiment, similarly to the eighth preferred embodiment, the transistor Q18 is kept off during a period in which the signal input to the input terminal IN is at the H level (active period), and in the period other than the active period, turns on in accordance with the rising of the clock signal input to the second clock terminal CK2 and turns off in accordance with the rising of the clock signal input to the first clock terminal CK1. Accordingly, the transistor Q18 operates complementarily to the transistor Q5 during the non-selected period, so that there is no period in which the node N1 is in the high impedance state.

The gates of the transistors Q20 and Q23 may be connected to the node N1 by applying the fourteenth preferred embodiment to the circuit shown in FIG. 33.

Nineteenth Preferred Embodiment

Figure 34:
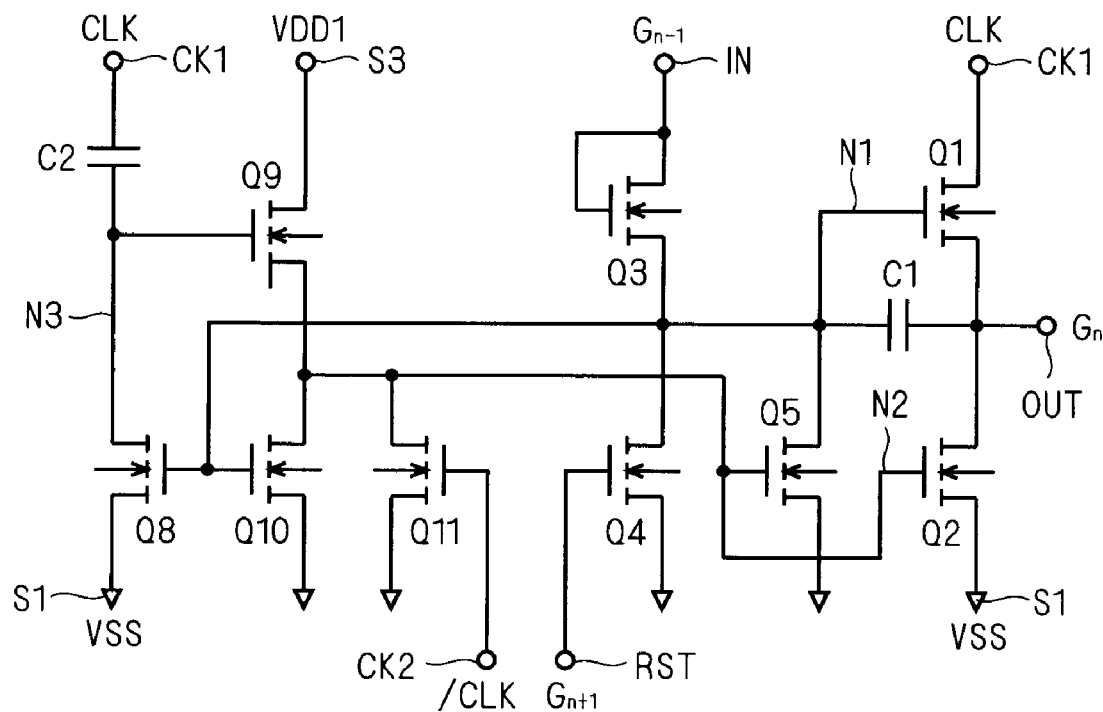
FIG. 34 is a circuit diagram illustrating the configuration of a unit shift register according to a nineteenth preferred embodiment of the present invention.

FIG. 34 is a circuit diagram illustrating the configuration of a unit shift register according to a nineteenth preferred embodiment of the present invention. In this drawing, elements having similar functions as those shown in FIG. 7 are indicated by the same reference characters. In the present embodiment, the transistor Q9 has its drain connected to a third power terminal S3 supplied with a predetermined high supply voltage VDD1, rather than the first clock terminal CK1.

According to the present embodiment, the loading capacitance of the clock signal (CLK or /CLK) input to the first clock terminal CK1 decreases in each unit shift register SR, which increases the rising and falling rates of the clock signal. This achieves the effect of easily speeding up the clock signal (i.e., increasing the frequencies) in order to make the shift register operate at high speeds.

The potential VDD1 shall be a potential at which the transistor Q9 operates in the saturated region when the node N3 rises to the H level. In other words, defining the voltage at the node N3 as V (N3), the potential VDD1 shall satisfy the following relation:

$$VDD1 \geq V(N3) - Vth.$$

The present embodiment may be applied to the unit shift register SR according to each of the above-described preferred embodiments. The potential VDD1 supplied to the third power terminal S3 may be the same as the potential VDD supplied to the second power terminal S2 in each of the above-described preferred embodiments. In that case, the third power terminal S3 and second power terminal S2 can be made of the same terminal, which can simplify the circuit.

Twentieth Preferred Embodiment

Figure 35:
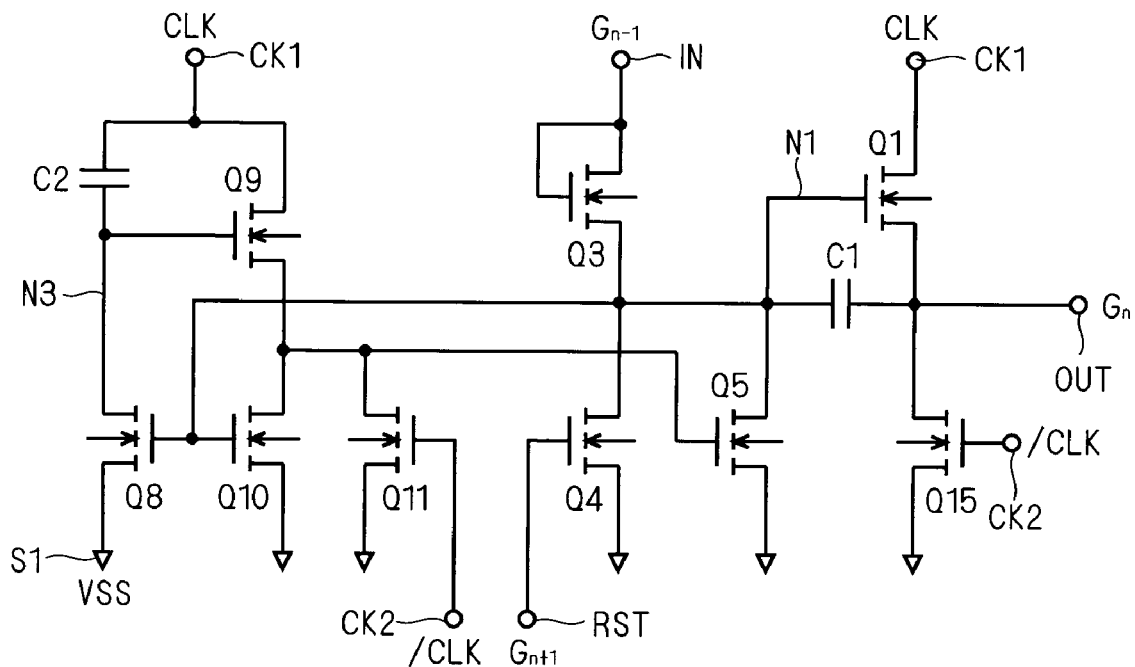
FIG. 35 is a circuit diagram illustrating the configuration of a unit shift register according to a twentieth preferred embodiment of the present invention.

FIG. 35 is a circuit diagram illustrating the configuration of a unit shift register according to a twentieth preferred embodiment of the present invention. In the present embodiment, the transistor Q2 is omitted from the unit shift register SR according to the fifth preferred embodiment (FIG. 14).

The transistors Q2 and Q5 in the circuit shown in FIG. 14 are both intended to discharge (pull down) the output terminal OUT in the non-selected period, while they turn on with different timing. Accordingly, even when the transistor Q2 is omitted as shown in FIG. 35, the output terminal OUT of the unit shift register $SR_n$ in the non-selected period is repeatedly brought into the L level with low impedance at the time when the clock signal /CLK reaches the H level, which prevents the unit shift register $SR_n$ from malfunctioning.

The gate of the transistor Q5 serves as the output node of the buffer circuit formed of the transistors Q9 and Q10 similarly to each of the above-described preferred embodiments. Therefore, in the present embodiment, the gate of the transistor Q5 is supplied with a voltage of large amplitude, thus achieving the reduction of pull-down resistance at the node N1 of the unit shift register $SR_n$.

Further, since the gate of the transistor Q2 is not connected to the output node of the buffer circuit, the loading capacitance on the output node is reduced. Therefore, the transistors Q9 and Q10 may have smaller driving capability than in the above-described preferred embodiments, allowing size reduction of the transistors Q9 and Q10, which contributes to the reduction in area for forming the unit shift register SR according to the present embodiment.

In other words, according to the present embodiment, the transistor Q2 having its gate connected to the output node of the buffer circuit is replaced by the transistor Q15 having its gate connected to the second clock terminal CK2 as the pull-down transistor for the output terminal OUT. The present embodiment may be applied to each of the above-described preferred embodiments.

Twenty-First Preferred Embodiment

Figure 36:
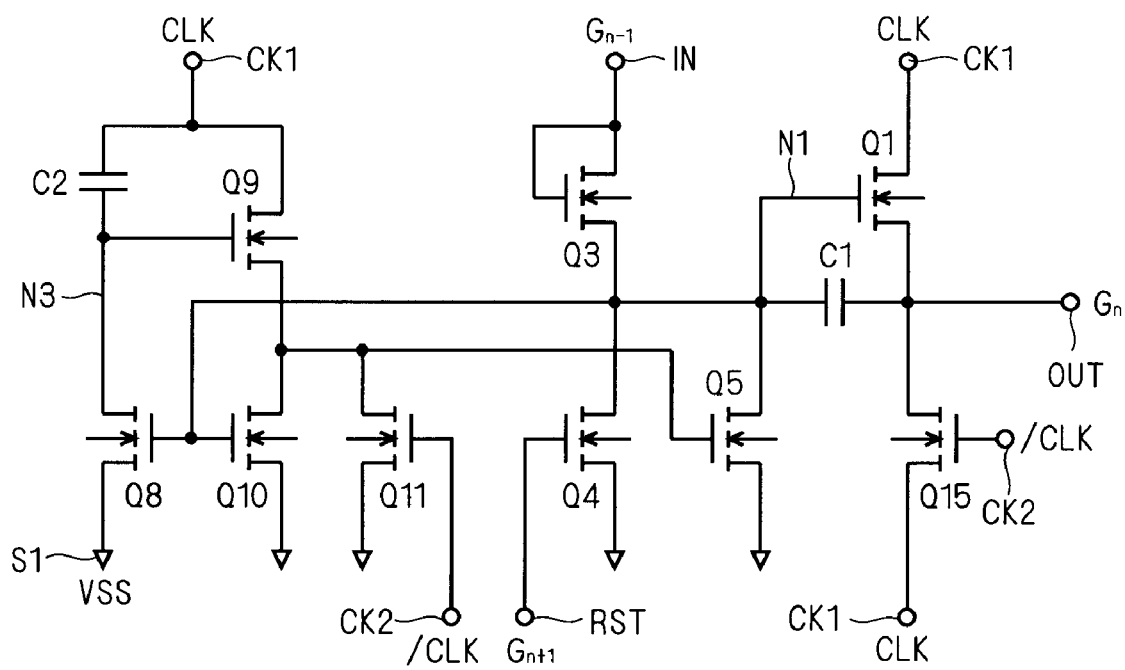
FIG. 36 is a circuit diagram illustrating the configuration of a unit shift register according to a twenty-first preferred embodiment of the present invention.

FIG. 36 is a circuit diagram illustrating the configuration of a unit shift register according to a twenty-first preferred embodiment of the present invention. In the present embodiment, the transistor Q15 in the circuit according to the twentieth preferred embodiment (FIG. 35) has its source connected to the first clock terminal CK1, rather than the first power terminal S1.

In the unit shift register $SR_n$ shown in FIG. 7, the gate of the transistor Q15 is repeatedly positive-biased by the clock signal /CLK, so that the Vth shift is likely to occur. In contrast, in the unit shift register $SR_n$ according to the present embodiment, the gate-to-source bias of the transistor Q15 is changed between positive when the clock signal /CLK is at the H level and negative when the clock signal CLK is at the H level. This minimizes the Vth shift of the transistor Q15, which achieves the effect that the node N2 can be discharged with low impedance.

While the invention has been shown and described in detail, the foregoing description is in all aspects illustrative and not restrictive. It is therefore understood that numerous modifications and variations can be devised without departing from the scope of the invention.

What is claimed is:

1. A shift register comprising:
   an input terminal, an output terminal, a reset terminal and a first clock terminal;
   a first transistor configured to supply a first clock signal received at said first clock terminal to said output terminal;
   a second transistor configured to discharge said output terminal;
   a third transistor having a control electrode connected to said input terminal and configured to charge a first node connected to a control electrode of said first transistor;
   a fourth transistor having a control electrode connected to said reset terminal and configured to discharge said first node;
   a fifth transistor having a control electrode connected to a predetermined second node and configured to discharge said first node;
   a first buffer circuit configured to receive an output from a first inverter circuit and output a signal to said predetermined second node; and
   said first inverter circuit in which said first node serves as an input node, wherein
   said first inverter circuit includes:
   a sixth transistor having a control electrode connected to said first node and configured to discharge an output node of said first inverter circuit; and
   a first capacitive element connected between said output node of said first inverter circuit and said first clock terminal.

2. A shift register comprising:
   an input terminal, an output terminal, a reset terminal and a first clock terminal;
   a first transistor configured to supply a first clock signal received at said first clock terminal to said output terminal;
   a second transistor configured to discharge said output terminal;
   a third transistor having a control electrode connected to said input terminal and configured to charge a first node connected to a control electrode of said first transistor;
   a fourth transistor having a control electrode connected to said reset terminal and configured to discharge said first node;
   a fifth transistor having a control electrode connected to a predetermined second node and configured to discharge said first node;
   a first inverter circuit in which said first node serves as an input node; and
   a first buffer circuit configured to receive an output from said first inverter circuit and output a signal to said predetermined second node, wherein
   said first buffer circuit includes:
   a sixth transistor having a control electrode connected to an output node of said first inverter circuit and configured to charge said predetermined second node, said sixth transistor connected between said first clock terminal and said predetermined second node; and
   an seventh transistor having a control electrode connected to one of said first node and said output terminal, and configured to discharge said predetermined second node.

* * * * *